United States Patent
Sorori et al.

(10) Patent No.: US 6,468,711 B1
(45) Date of Patent: Oct. 22, 2002

(54) PHOTOSENSITIVE COMPOSITION AND METHOD FOR MANUFACTURING LITHOGRAPHIC PRINTING PLATE

(75) Inventors: Tadahiro Sorori; Tatsuji Higashi; Koichi Kawamura, all of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/392,259

(22) Filed: Sep. 9, 1999

(30) Foreign Application Priority Data

| | | |
|---|---|---|
| Sep. 9, 1998 | (JP) | 10-255370 |
| Sep. 21, 1998 | (JP) | 10-266598 |
| Mar. 10, 1999 | (JP) | 11-063409 |

(51) Int. Cl.⁷ .............................................. G03F 7/004
(52) U.S. Cl. ................................. 430/270.1; 430/286.1
(58) Field of Search .......................... 430/270.1, 286.1, 430/302

(56) References Cited

U.S. PATENT DOCUMENTS

| | | | | |
|---|---|---|---|---|
| 4,258,123 A | * | 3/1981 | Nagashima et al. | 430/281 |
| 4,497,888 A | * | 2/1985 | Nishioka et al. | 430/165 |
| 5,275,928 A | * | 1/1994 | Fabricius | 430/567 |
| 5,691,394 A | | 11/1997 | Kondo | 522/29 |
| 5,731,363 A | | 3/1998 | Okamoto et al. | 522/16 |
| 5,828,684 A | * | 10/1998 | Van de Walle | 372/45 |
| 6,048,654 A | * | 4/2000 | Nakayama et al. | 430/19 |
| 6,322,950 B1 | * | 11/2001 | Sorori et al. | 430/281.1 |

FOREIGN PATENT DOCUMENTS

| | | | |
|---|---|---|---|
| DE | 3719355 A | | 12/1987 |
| EP | 0368327 A | | 5/1990 |
| EP | 0747771 A | | 12/1996 |
| JP | 8-262715 | | 10/1996 |
| JP | 09068794 A | * | 3/1997 |
| JP | 8-272096 | | 10/1997 |
| JP | 09328505 A | | 12/1997 |

* cited by examiner

Primary Examiner—Janet Baxter
Assistant Examiner—Barbara Gilmore
(74) Attorney, Agent, or Firm—Burns, Doane, Swecker & Mathis, LLP

(57) ABSTRACT

A photosensitive composition comprising: a titanocene compound; and at least one dye selected from: carbonyl compounds represented by formula (I):

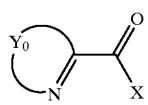

(I)

wherein Y represents a nonmetallic atom group for forming a nitrogen-containing heterocyclic ring together with the adjacent N and carbon atom, and X represents a monovalent nonmetallic atom group; and merocyanine compounds represented by formula (II):

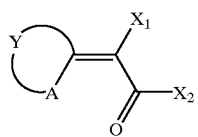

(II)

wherein A represents S atom or $NR_1$, $R_1$ represents an alkyl group or an aryl group, Y represents a nonmetallic atom group for forming a basic nucleus of the dye together with the adjacent A and carbon atom, $X_1$ and $X_2$ each independently represents a monovalent nonmetallic atom group, and $X_1$ and $X_2$ may be combined with each other to form the acidic nucleus of a dye. Also disclosed is a method for manufacturing a lithographic printing plate using the photosensitive composition.

7 Claims, No Drawings

US 6,468,711 B1

PHOTOSENSITIVE COMPOSITION AND METHOD FOR MANUFACTURING LITHOGRAPHIC PRINTING PLATE

FIELD OF THE INVENTION

The invention relates to a novel photosensitive composition, particularly, a photosensitive composition having high sensitivity and excellent stability. More specifically, the present invention relates to a photosensitive composition comprising a novel photopolymerization initiating systems which has excellent sensitivity to light over a wide region of the from 350 to 450 nm emitted from a InGaN-type semiconductor laser or the like. Furthermore, the present invention relates to photosensitive composition as an excellent material for a lithographic printing precursor, particularly a lithographic printing precursor capable of manufacturing a lithographic printing plate by scan exposure based on digital signals.

In addition, the present invention also relates to a method for manufacturing a lithographic printing plate. Specifically, the present invention related to a method for manufacturing a lithographic printing plate which is favored with good profitability, high productivity and excellent workability in the printing process and which can be manufactured by the scan exposure based on digital signals.

BACKGROUND OF THE INVENTION

Heretofore, PS plates having a structure such that a lipophilic photosensitive resin is provided on a hydrophilic support have been widely used for the lithographic printing plate. The PS plate is usually subjected to mask exposure (surface exposure) through a lith film and thereafter, the non-image area is dissolved and removed to obtain a desired printing plate.

In recent years, digitization technique is prevailing, where image information is electrically processed, stored and output. To cope With such digitization technique, various image output methods are newly put into practice. As a result thereof, computer-to-plate (CTP) technique of scanning light having high directivity such as laser ray according to digitized image information and thereby directly manufacturing a printing plate without having intervention of lith film is keenly demanded. To this purpose, there have been important technical problems to obtain a photosensitive composition, a lithographic printing precursor and a plate-making method, suitable therefor.

Among conventional CTP systems, a photosensitive material containing a photopolymerization system using titanocene as a photoinitiator is excellent and in particular, a combination with a carbomerocyanine-base dye described in JP-A-8-272096 and JP-A-8-262715 is known. However, this system has a problem in that the light source used is a visible light source having a relatively long wavelength, such as Ar laser (488 nm) and FD-YAG laser (532 nm), therefore, a photosensitive material having high sensitivity in the vicinity of 500 nm is used. Because of this, all works such as taking out of a plate from a corrugated fiberboard box, loading of the plate into a cassette of a plate setter and insertion of the plate into the plate setter, are necessary to be done under dark red safelight. Thus, the workability is very bad and it is strongly demanded to construct a CTP system such that the plate can be worked under brighter yellow or white safelight.

On the other hand, the laser technology is making remarkable progress in recent years. For example, practical use of a semiconductor laser capable of continuous oscillation in the region of from 350 to 450 nm has been realized using an InGaN-system material. If a CTP system using such a short wave light source could be constructed, a photosensitive material having sensitivity in a shorter wavelength region and therefore, enabling working under brighter safelight may be used. The semiconductor laser is furthermore very preferred as a light source for CTP system because it can be inexpensively produced in view of the structure.

From these reasons, it is eagerly demanded in this industrial field to obtain a photosensitive composition, a lithographic printing precursor and a plate-making method, suitable for the CTP system using a relatively short-wave semiconductor laser of from 350 to 450 nm.

Furthermore, the technique for obtaining a photosensitive composition having high sensitivity to She short-wave semiconductor laser region of from 350 to 450 nm is important and the demand therefor is more and more increasing not only in the field of CTP but also in other industrial fields over a wide range, for example, in the field of laser imaging such as photofabrication, holography and color hard copy, in the field of electric material production such as photoresist, and in the field of photocurable resin material such as ink, paint and adhesive.

SUMMARY OF THE INVENTION

An object of the present invention is to provide a novel photosensitive composition having high sensitivity to the wavelength of from 350 to 450 nm.

Another object of the present invention is to provide a photosensitive composition which ensures, when used in the photosensitive layer or the like of a scan exposure lithographic printing plate, high sensitivity to the oscillation wavelength of an inexpensive short wave semiconductor laser, good workability, high profitability and suitability for the CTP system.

A yet other object of the present invention is to provide a method for manufacturing by scan exposure a lithographic printing plate suitable for CTP system, in which excellent workability and profitability are ensured and an inexpensive short wave semiconductor laser can be used.

Other objects and effects of the present invention will become apparent from the following description.

As a result of extensive investigations to attain these objects, the present inventors have found that a photosensitive composition containing a photoinitiation system using a combination with a specific compound exhibits sufficiently high sensitivity to the oscillation wavelength of a short-wave semiconductor laser and can be worked under bright light. The present invention has been accomplished based on this finding.

That is, the above-described objects of the present invention have been achieved by providing the following compositions and methods.

1) A photosensitive composition comprising:
   a titanocene compound; and
   at least one dye selected from: carbonyl compounds represented by formula (I):

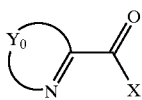

(I)

wherein $Y_0$ represents a nonmetallic atom group for forming a nitrogen-containing heterocyclic ring together with the adjacent N and carbon atom, and X represents a monovalent nonmetallic atom group; and merocyanine compounds represented by formula (II):

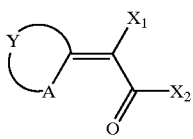

(II)

wherein A represents S atom or $NR_1$, $R_1$ represents an alkyl group or an aryl group, Y represents a nonmetallic atom group for forming a basic nucleus of the dye together with the adjacent A and carbon atom, $X_1$ and $X_2$ each independently represents a monovalent nonmetallic atom group, and $X_1$ and $X_2$ may be combined with each other to form the acidic nucleus of a dye.

2) The photosensitive composition according to the above 1), wherein said dye is a carbonyl compound of formula (I).

3) The photosensitive composition according to the above 2), further comprises an addition polymerizable compound having at least one ethylenically unsaturated double bond.

4) The photosensitive composition according to the above 1), wherein said dye is a merocyanine compound of formula (II).

5) The photosensitive composition according to the above 4), further comprises an addition polymerizable compound having at least one ethylenically unsaturated double bond.

6) The photosensitive composition according to the above 4), wherein said merocyanine compound is represented by the following formulae (II-2), (II-3) or (II-4):

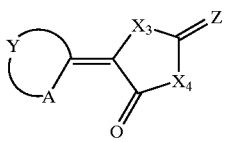

(II-2)

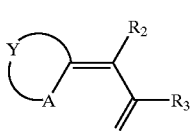

(II-3)

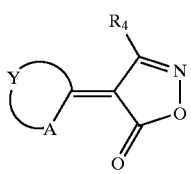

(II-4)

wherein A and Y have the same meanings as in formula (II), $X_3$, $X_4$ and Z each independently represents O atom, S atom or $NR_5$, $R_5$ represents an alkyl group or an aryl group, $R_2$ represents hydrogen atom, an alkyl group, an alkoxy group, an aryloxy group, an alkylthio group, an arylthio group, an alkylamino group or an arylamino group, $R_3$ represents hydrogen atom, an alkyl group, an aryl group, a heteroaryl group, an alkoxy group, an aryloxy group, an alkylthio group, an arylthio group, an alkylamino group or an arylamino group, and $R_4$ represents hydrogen atom, an alkyl group, an aryl group or a heteroaryl group.

7) A method for manufacturing a lithographic printing plate, comprising
scan-exposing a lithographic printing precursor with a laser ray having a wavelength shorter than 450 nm,
wherein said lithographic printing precursor comprises a hydrophilic support having provided thereon a photosensitive layer comprising:
a titanocene compound; and
at least one dye selected from: carbonyl compounds represented by formula (I):

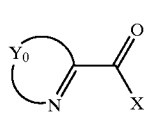

(I)

wherein $Y_0$ represents a nonmetallic atom group for forming a nitrogen-containing heterocyclic ring together with the adjacent N and carbon atom, and X represents a monovalent nonmetallic atom group; and merocyanine compounds represented by formula (II):

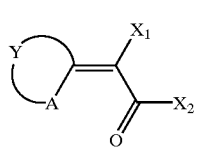

(II)

wherein A represents S atom or $NR_1$, $R_1$ represents an alkyl group or an aryl group, Y represents a nonmetallic atom group for forming a basic nucleus of the dye together with the adjacent A and carbon atom, $X_1$ and $X_2$ each independently represents a monovalent nonmetallic atom group, and $X_1$ and $X_2$ may be combined with each other to form the acidic nucleus of a dye.

8) The method according to the above 7), wherein the scan exposure is carried out with a multi laser beam of external drum system.

9) The method according to the above 8), wherein the number of the laser beams is 10 or more.

The technique for obtaining a photopolymerizable composition having high sensitivity to the short-wave semiconductor laser region of from 350 to 450 nm is important and the demand therefor is more and more increasing not only in the field of CTP but also in other industrial fields over a wide range, for example, in the field of laser imaging such as photofabrication, holography and color hard copy, in the field of electric material production such as photoresist, and in the field of photocurable resin material such as ink, paint and adhesive.

Furthermore, for the purpose of attaining higher function (higher sensitivity) of image forming materials and photocurable materials over a wide range, it is more keenly demanded to obtain a high sensitivity photoinitiation system which efficiently decomposes by light to generate active seeds such as radical or acid. The radical generated by the interaction of the photoinitiation system of the present invention and light may be used, for example, in combination with a radical polymerizable compound and photocured or crosslinked to form a negative image, or may be used in combination with a compound variable in the absorption due to oxidation or radical addition to a chromophoric π electron system, to cause photo-coloration or decoloration. The acid generated by the interaction between the photoinitiation system and light may be used in combination with an acid decomposable compound or acid cross-linking compound to form a positive or negative image, or may be used in combination with a compound variable in the absorption by an acid to cause photo-coloration or decoloration. The photoinitiation system in usual can generate both a radical and an acid, therefore, by simultaneously combining it with both a radical reactive compound and an acid reactive compound, the photoinitiation system may be applied to various image formation systems or photo-response materials.

DETAILED DESCRIPTION OF THE INVENTION

The mode for carrying out the present invention is described in detail below.
A. Photoinitiation System (I) In a first embodiment, the photoinitiation system of the photosensitive composition of the present invention comprises a carbonyl compound having a specific structure and a titanocene compound. The carbonyl compound and the titanocene compound for use in the present invention are individually known to act as a photoinitiator, however, in the present invention, it is found that when these two compounds are simultaneously used in combination, the sensitivity in the wavelength region corresponding to the absorption band particularly of the carbonyl compound is extremely improved. The functions of these two compounds for use in the present invention are not clearly known, however, the carbonyl compound seems to mainly function as a sensitizing dye and absorb the exposure light to thereby provide the excited state and accelerate generation of initiating radicals from the titanocene compound present together (this process is hereinafter referred to as "dye sensitization").

A first advantage of the carbonyl-base sensitizing dye of the present invention is in that the absorption wavelength thereof lies in the region of from 350 to 450 nm. Many titanocene compounds which will be described later have weak absorption by themselves in the visible region near to 500 nm in addition to the absorption in the ultraviolet ray region and exhibit sensitivity there. As the second advantage, the carbonyl-base sensitizing dye greatly improves the sensitivity of titanocene, therefore, the amount of titanocene compound used can be reduced to a relatively small amount. As a result, sufficiently high sensitivity can be attained in the short wave region and at the same time, the sensitivity in the region of 500 nm by the titanocene compound itself is decreased to such an extent of causing substantially no problem.

The reason why the carbonyl-base sensitizing dye for use in the present invention is particularly excellent in the dye sensitization activity cannot be described clearly because the mechanism of dye sensitization is not elucidated, but it may be considered as follows. In the carbonyl-base sensitizing dye contained in the photoinitiation system of the present invention, the π electron system (the moiety of —N=C—C=O in formula (I)) directly participating in the absorption of dye comprises a relatively short conjugate system and has a relatively rigid structure, therefore, the excited state induced by the light absorption of dye continues long as compared with the case of using a carbomerocyanine-base dye described, for example, in JP-A-8-272096 and JP-A-8-262715, thereby increasing the efficiency of dye sensitization reaction. In addition, the carbonyl-base dye for use in the present invention is considered to be a compound having low electron donating property (electrochemical oxidation or reduction potential is relatively on the positive side; HOMO or LUMO orbital energy according to the molecular orbital method is large on the negative side), and this seems to have an advantageous effect on the improvement of the dye sensitization efficiency. Also, the increase of radical generation efficiency may be considered to result from the coordination of carbonyl structure or —N=C—C=O moiety in formula (I) of the present invention to the photoreaction intermediate of titanocene.

(A1) Sensitizing Dye (I)

The carbonyl-base sensitizing dye for use in the present invention is represented by the following formula (I):

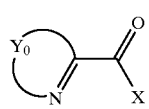
(I)

wherein $Y_0$ represents a nonmetallic atom group for forming a nitrogen-containing heterocyclic ring together with the adjacent N and carbon atom, and X represents a monovalent nonmetallic atom group.

Formula (I) is described in detail below. $Y_0$ represents a nonmetallic atom group necessary for forming a nitrogen-containing heterocyclic ring together with the adjacent N atom and the adjacent carbon atom. Examples of preferred nitrogen-containing heterocyclic rings include a nitrogen-containing heterocyclic ring group constituting cyanine base compounds described in F. M. Hamer, *The Chemistry of Heterocyclic Compounds*, Vol. 18, "The Cyanine Dyes and Related Compounds" (1964), Johan Willey & Sons (New York).

Specific examples thereof include thiazoles (e.g., thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole), benzothiazoles (e.g., benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, 5-ethoxycarbonylbenzothiazole), naphthothiazoles (e.g., naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, 7-methoxynaphtho [1,2]thiazole), thianaphtheno-7',6', 4,5-thiazoles (e.g., 4'-methoxythianaphtheno-7', 6', 4,5-thiazole), oxazoles (e.g., 4-methyloxazole, 5-methyloxazole, 4-phenyloxazole, 4,5-diphenyloxazole, 4-ethyloxazole, 4,5-dimethyloxazole, 5-phenyloxazole), benzoxazoles (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, 6-hydroxybenzoxazole), naphthoxazoles (e.g., naphth[1,2]oxazole, naphth[2,1]oxazole), selenazoles (e.g., 4-methylselenazole, 4-phenylselenazole), benzoselenazoles (e.g., benzoselenazole, 5-chlorobenzoselenazole, 5-methoxybenzoselenazole, 5-hydroxybenzoselenazole, tetrahydrobenzoselenazole), naphthoselenazoles (e.g., naphtho[1,2]selenazole, naphtho[2,1]selenazole), thiazolines (e.g., thiazoline, 4-methylthiazoline), 2-quinolines (e.g., quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline), 4-quinolines (e.g., quinoline, 6-methoxyquinoline, 7-methylquinoline, 8-methylquinoline), 1-isoquinolines (e.g., isoquinoline, 3,4-dihydroisoquinoline), 3-isoquinolines (e.g., isoquinoline), imidazoles (e.g., imidazole), benzimiciazoles (e.g., 1,3-diethylbenzimidazole, 1-ethyl-3-phenylbenzimidazole), 3,3-dialkylindolenines (e.g., 3,3-dimethylindolenine, 3,3,5-trimethylindolenine, 3,3,7-trimethylindolenine), 2-pyridines (e.g., pyridine, 5-methylpyridine), and,4-pyridines (e.g., pyridine). In addition, diazoles (e.g., 1,3,4-oxadiazole, 1,3,4-thiadiazole, 1,3,4-selenadiazole), triazoles (e.g., 1,2,4-triazole), pyrazines, quinoxalines, triazines (e.g., 1,3,5-triazine), phenanthridine, 2H pyrroles, pyrazoles, isothiazoles, isooxazoles,. pyrimidines, pyridazinnes, indazoles, phthalazines, naphthylidines, quinazolines, cinnolines, pteridines, β-carbolines perimidines and furazanes may also be suitably used In the nitrogen-containing heterocyclic ring formed by $Y_4$ together with the adjacent N and the adjacent carbon atom, the hydrogen atom constituting the ring may be displaced by any substituent. Preferred examples of the substituent include an alkyl group, a substituted alkyl group, a halogen atom (e.g., —F, —Br, —Cl, —I), a hydroxyl group, an aloxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N,N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N,N'-dialkylureido group, an N'-arylureido group, an N,N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-alkylureido group, an N'-alkyl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter called a phosphonate group), a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and a conjugate base group thereof (hereinafter called an alkylphosphonate group), a monoarylphosphono group (—$PO_3H (aryl)$) and a conjugate base group thereof (hereinafter called an arylphosphonate group), a phosphonooxy group (—$OPO_3H_2$) and a conjugate base group thereof (hereinafter called a phosphonate oxy group), a dialkyylphosphonooxy group (—$OPO_3(alkyl)_2$), a diarylphosphonooxy group (—$OPO_3(aryl)_2$), an alkylarylphosphonooxy group (—$OPO_3(alkyl)(aryl)$), a monoalkyl-phosphonooxy group (—$OPO_3H(alkyl)$) and a conjugate base group thereof (hereinafter called an alkylphosphonate oxy group), a monoarylphosphonooxy group (—$OPO_3H(aryl)$) and a conjugate base group thereof (hereinafter called an arylphosphonate oxy group), a cyano group, a nitro group, an aryl group, a heteroaryl group, an alkenyl group and an alkynyl group.

Among these substituents, the alkyl group is preferably a linear, branched or cyclic alkyl group having from 1 to 20 carbon atoms Specific examples thereof include a methyl group, an ethyl group, a propyl group, a butyl group a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, a linear alkyl group having from 1 to 12 carbon atoms, a branched alkyl group having from 3 to 12 carbon atoms and a cyclic alkyl group having from 5 to 10 carbon atoms are more preferred.

The alkylene group in the substituted alkyl group includes a divalent organic residue resulting from eliminating any one of hydrogen atoms on the above-described alkyl group having from 1 to 20 carbon atoms, and preferred are a linear alkylene group having from 1 to 12 carbon atoms, a branched alkylene group having from 3 to 12 carbon atom and a cyclic alkylene group having from 5 to 10 carbon atoms.

The substituent of the substituted alkyl group may be any and preferred examples of the substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminbethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl) carbamoylethyl group, an N-methyl-N-(sulfophenyl) carbamoylmethyl group, a sulfobutyl group, a sulfonate butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonate hexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group in these substituents include a condensed ring formed by from 1 to 3 benzene rings and a condensed ring formed by a benzene ring and a γ-membered unsaturated ring. Specific examples thereof include a phenyl group, a naphthyl group, an anthryl group, a phenanthryl group, an indenyl group, an acenaphthenyl group and a fluorenyl group. Among these, a phenyl group and a naphthyl group are preferred.

The substituted aryl group includes those having a monovalent nonmetallic atom group exclusive of hydrogen as a substituent on the ring-forming carbon atoms of the above-described aryl group. Preferred specific examples of the substituted aryl group include a biphenyl group, a tolyl group, a xylyl group, a mesityl aroup, a cumenyl group, a chlorophenyl group, a bromophenyl group, a fluorophenyl group, a chloromethylphenyl group, a trifluoromethylphenyl group, a hydroxyphenyl group, a methoxyphenyl group, a, methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl) carbamoylphenyl group, an N-methyl-N-(sulrophenyl)-carbamoylphenyl group, a sulfophenyl group, a sulfonatephenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)-sulfamoylphenyl group, a phosphonophenyl group, a phosphonatephenyl group, a diethylphosphonophenyl group, a diphenylphosphonophenyl group, a methylphosphonophenyl group, a methylphosphonalephenyl group, a tolylphosphonophenyl group, a tolylphosphonatephenyl group, an allyl group, a 1-propenylmethyl group, 2-butenyl group, a 2-methylallylphenyl group, a 2-methylpropenylphenyl group, a 2-propynylphenyl group, a 2-butynylphenyl group and a 3-butynylphenyl group.

The heteroaryl group which can be used is a monocyclic or polycyclic aromatic ring group containing at least one of nitrogen, oxygen and sulfur atoms, preferably a 5- or 6-membered aromatic substituent such as furan, pyrrole and pyridine.

Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group and a trimethylsilylethynyl group.

In the acyl group ($G_1CO—$), $G_1$ is hydrogen or the above-described alkyl or aryl group. Among these substituents, preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-diaikylcarbamoyl group, an N-arylcarbamoyl group, an N-alkyl-N-arylcarbamoyl group, a sulfo group, a sulfonate group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonate group, a dialkylphosphono group, a diarylphosphono group, a monoalkylphosphono group, an alkylphosphonate group, a monoarylphosphono group, an arylphosphonate group, a phosphonooxy group, a phosphonate oxy group, an aryl group and an alkenyl group.

Among the examples of the nitrogen-containing heterocyclic ring formed by $Y_0$ together with the adjacent N and the adjacent carbon atom in formula (I), dyes having a structure represented by the following partial structural formula (I-A) are particularly preferred because the dyes can give a photoinitiation system having high sensitization activity and very excellent storage stability. Partial Structural Formula (I-A):

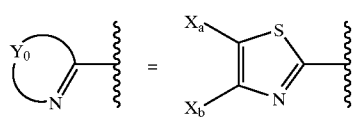

wherein $X_a$ and $X_b$ each independently represents a substituted or unsubstituted alkyl group, an aryl group or a heteroaryl group, and $X_a$ and $X_b$ may be combined with each other to form a 5-, 6- or 7-membered aliphatic or aromatic ring.

Specific examples of $X_a$ and $X_b$ include those described above as examples of the substituted or unsubstituted alkyl group, the aryl group and the heteroaryl group.

X in formula (I) is described below. X represents a monovalent nonmetallic atom group and, for example, any of those described above as examples of the substituent which may displace the hydrogen atom on a nitrogen-containing heterocyclic ring formed by $Y_0$ together with the adjacent N and the adjacent carbon atom in formula (I), or hydrogen atom may be suitably used. Among the substituents, an alkyl group which may be substituted, an aryl group which may be substituted, a heteroaryl group which may be substituted or an alkenyl group which may be substituted is advantageous in view of profitability because the dye may be produced from a relatively inexpensive starting material through a short process. Dyes where $Y_0$ is an aryl group which may be substituted, a heteroaryl group which may be substituted or an alkenyl group which may be substituted are advantageous in view of absorption wavelength and exhibit very excellent storage stability.

Specific examples of the aryl group and the substituted aryl group preferred as $Y_0$ include a phenyl group, a naphthyl group, an anthryl group, a phenanthryl group, an indenyl group, an acenaphthenyl group and a fluorenyl group. Specific examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatephenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phospnonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allyl group, a 1-propenylmethyl group, 2-butenyl group, a 2-methylallyiphenyl group, a 2-methylpropenylphenyl group, a 2-propynylphenyl group, a 2-butynylphenyl group and a 3-butynylphenyl group.

Examples of particularly preferred heteroaryl groups include those described above as examples of the nitrogen-containing heterocyclic ring formed by $Y_0$ together with the adjacent N and the adjacent carbon atom in formula (I) and any of these may be suitably used. Other examples include thiophene, thiathrene, furan, pyran, isobenzofurane, chromene, xanthene, phenoxazine, pyrrole, pyrazole, isothiazole, isooxazole, pyrazine, pyrimidine, pyridazine, indolidine, isoindolidine, indoyl, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, furazane and phenoxazine. These each may be benzo-condensed into a ring or may have a substituent.

Examples of the alkenyl group preferred as $Y_0$ include those described above as examples of the alkenyl group and additionally include those represented by the following partial structure (I-B).

Partial Structural Formula (I-B)

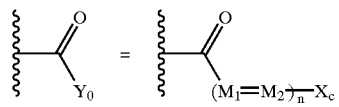

wherein $M_1$ and $M_2$ each independently represents a methine carbon which may be substituted, $X_c$ represents a substituted or unsubstituted aryl group or a heteroaryl group, and n is an integer of 1 or more.

When $M_1$ and $M_2$ each independently CH or $CCH_3$, the dye is particularly easily produced, and when n is 1 or 2, the dye obtained can have both excellent absorption property and high stability. $X_c$ may be any of those described above as examples of the substituted or unsubstituted aryl group or heteroaryl group.

Examples of the sensitizing dye for use in the present invention are more specifically shown below by Chemical Formulae (D1) to (D54), however, the present invention is by no means limited by the following chemical formulae and any sensitizing dye may be suitably used in the present invention as long as it satisfies the above-described constitutional requirements.

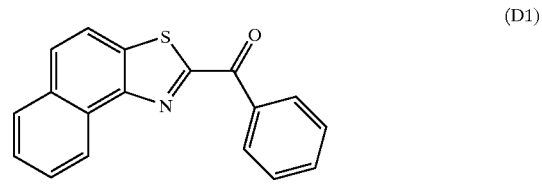
(D1)

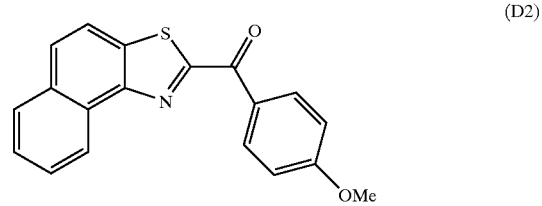
(D2)

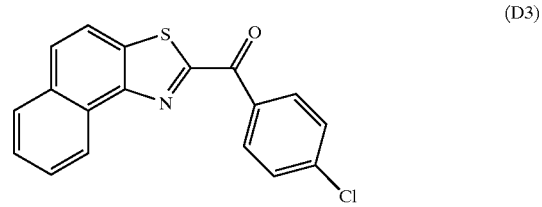
(D3)

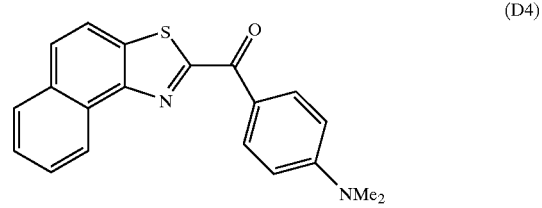
(D4)

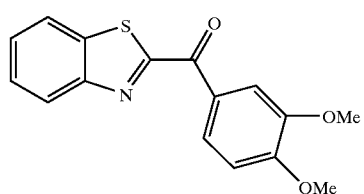
(D5)
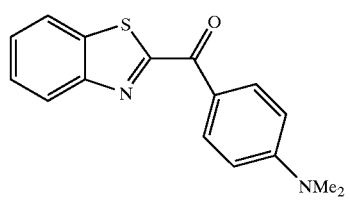
(D6)
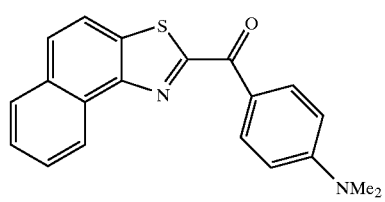
(D7)
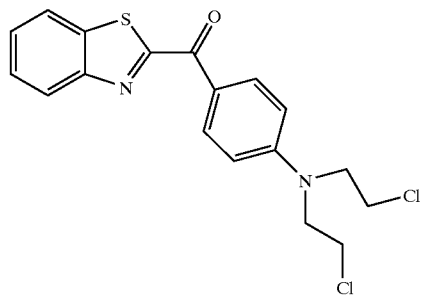
(D8)
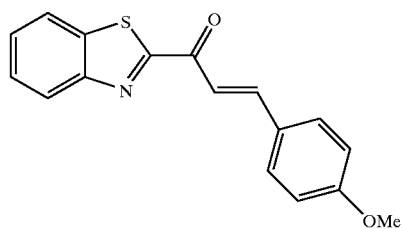
(D9)
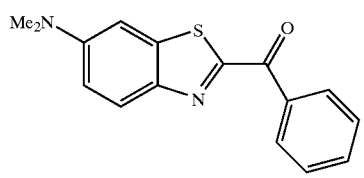
(D10)
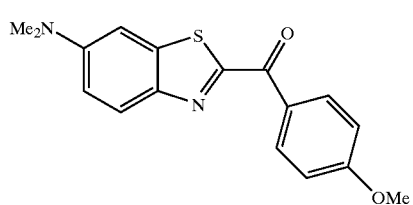
(D11)
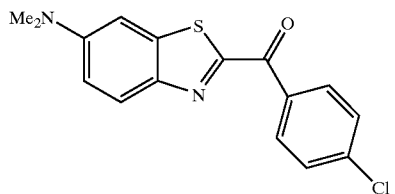
(D12)
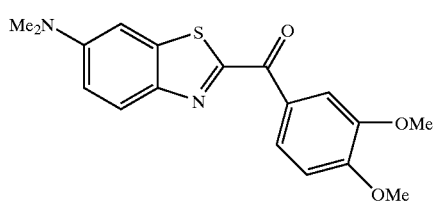
(D13)
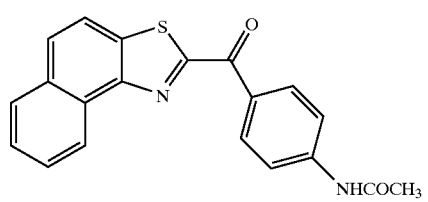
(D14)
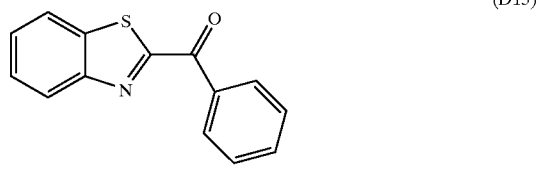
(D15)
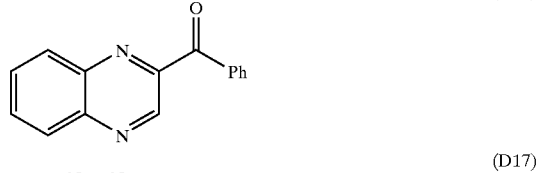
(D16)
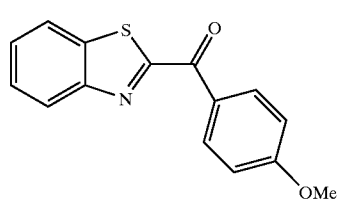
(D17)
(D18)
(D19)
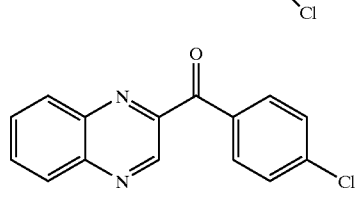
(D20)

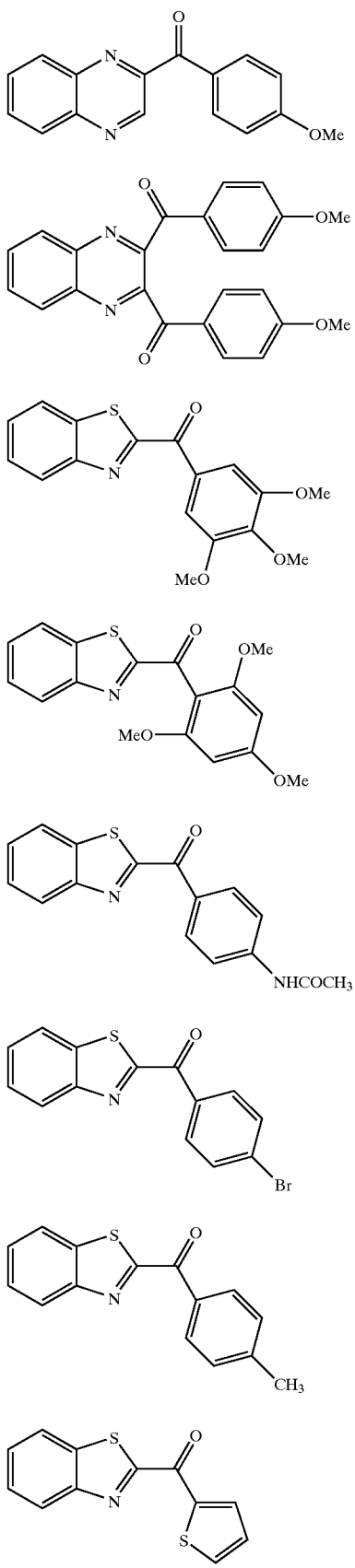
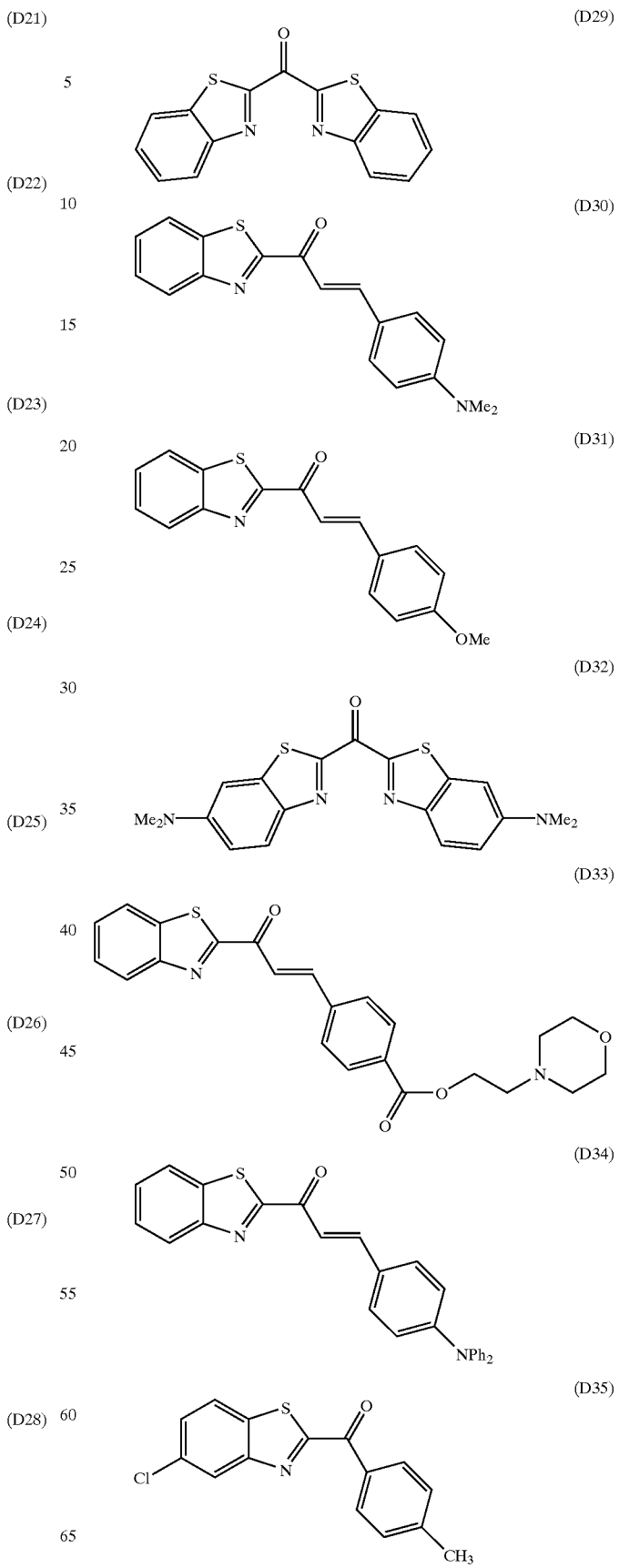

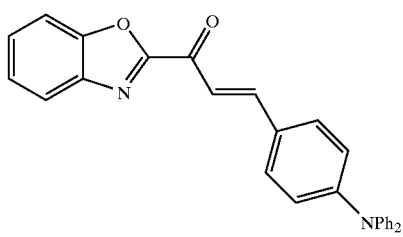 (D36)
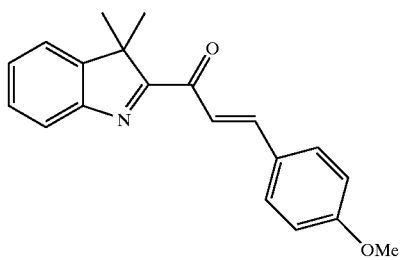 (D37)
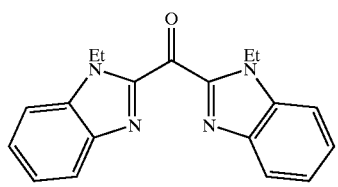 (D38)
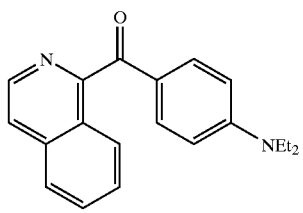 (D39)
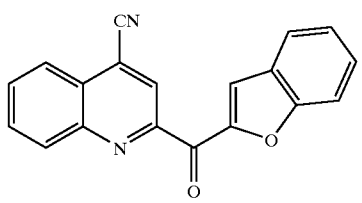 (D40)
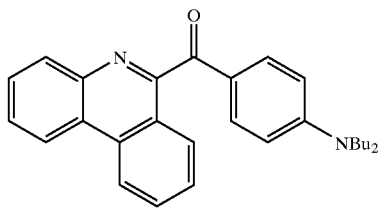 (D41)
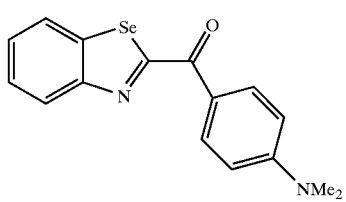 (D42)
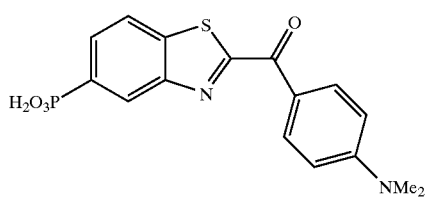 (D43)
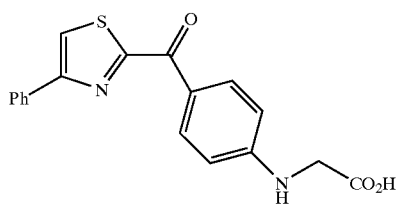 (D44)
 (D45)
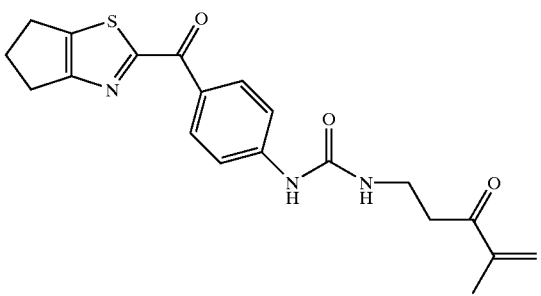 (D46)
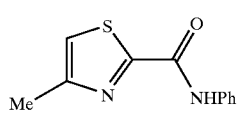 (D47)
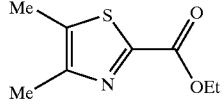 (D48)
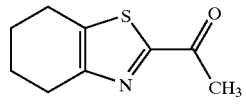 (D49)
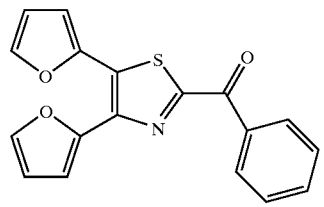 (D50)

-continued

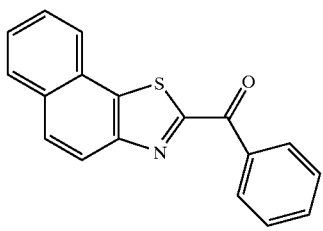
(D51)

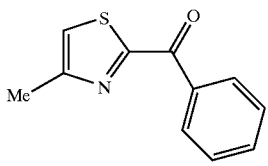
(D52)

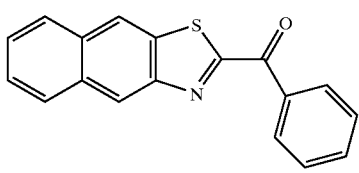
(D53)

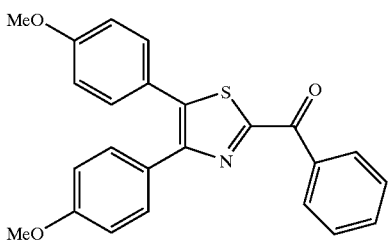
(D54)

The sensitizing dye represented by formula (I) can be easily synthesized by a known synthesis method or a synthesis method related thereto. The synthesis method is more specifically described, for example, in JP-B-6-97339.

(II) In a second embodiment, the photopolymerization initiating system as an essential component of the photosensitive composition of the present invention comprises a merocyanine-base sensitizing dye having a specific structure and a titanocene compound. In the photopolymerization initiating system for use in the present invention, the sensitizing dye is considered to mainly absorb light and thereby accelerate generation of initiating radicals from the titanocene compound present together (this process is hereinafter referred to as "dye sensitization"). One of the reasons why the merocyanine-base sensitizing dye of the present invention is particularly excellent is because the absorption wavelength thereof lies in the region of from 350 to 450 nm. Many titanocene compounds which will be described later have weak absorption by themselves in the wavelength region of from ultraviolet ray to the vicinity of 500 nm and exhibit sensitivity there. However, the merocyanine-base sensitizing dye having a specific structure of the present invention greatly improves the sensitivity of titanocene, therefore, the amount of titanocene compound used can be reduced to a relatively small amount. As a result, sufficiently high sensitivity can be attained in the short wavelength region and at the same time, the sensitivity in the region of 500 nm by titanocene itself is decreased to such an extent of causing substantially no problem. The reason why the merocyanine sensitizing dye having a specific structure of the present invention is particularly excellent in the dye sensitization activity cannot be described clearly because the mechanism of dye sensitization is not elucidated, but it may be considered as follows. In the merocyanine-base sensitizing dye of the present invention, the π electron system (the moiety of A—C=C—C=O in formulae (II) and (II-2) to (II-4) shown later) directly participating in the absorption of dye has a relatively rigid structure, therefore, the excited state induced by the light absorption of dye continues long as compared with the case of using a carbomerocyanine-base dye described, for example, in JP-A-8-272096 and JP-A-8-262715, thereby increasing the efficiency of dye sensitization reaction. In addition, the dye for use in the present invention is considered to be a compound having low electron donating property (electrochemical oxidation or reduction potential is relatively on the positive side; HOMO or LUMO orbital energy according to the molecular orbital method is large on the negative side), and this seems to have an advantageous effect on the improvement of the dye sensitization efficiency.

(A1) Sensitizing Dye (II)

The merocyanine-base sensitizing dye for use in the present invention is represented by formula (II). Furthermore, a novel high-sensitivity photopolymerization system composition may be obtained using a sensitizing dye represented by formula (II-2), (II-3) or (II-4):

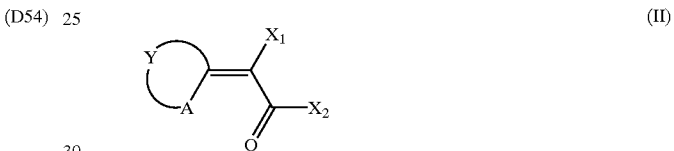
(II)

wherein A represents S atom or $NR_1$, $R_1$ represents an alkyl group or an aryl group, Y represents a nonmetallic atom group for forming a basic nucleus of the dye together with the adjacent A and carbon atom, $X_1$ and $X_2$ each independently represents a monovalent nonmetallic atom group, and $X_1$ and $X_2$ may be combined with each other to form the acidic nucleus of a dye;

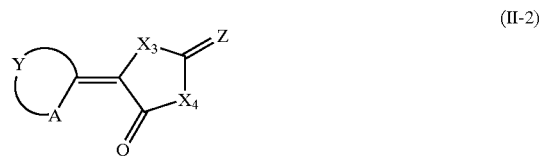
(II-2)

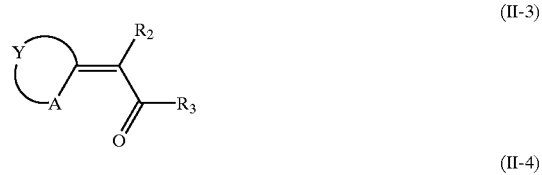
(II-3)

(II-4)

wherein A and Y have the same meanings as in formula (II), $X_3$, $X_4$ and Z each independently represents O atom, S atom or $NR_5$, $R_5$ represents an alkyl group or an aryl group, $R_2$ represents hydrogen atom, an alkyl group, an alkoxy group, an aryloxy group, an alkylthio group, an arylthio group, an alkylamino group or an arylamino group, $R_3$ represents hydrogen atom, an alkyl group, an aryl group, a heteroaryl group, an alkoxy group, an aryloxy group, an alkylthio group, an arylthio group, an alkylamino group or an arylamino group, and $R_4$ represents hydrogen atom, an alkyl group, an aryl group or a heteroaryl group.

Formulae (II) and (II-2) to (II-4) are described in detail below. A represents S atom or $NR_1$, $R_1$ represents a substituted or unsubstituted alkyl group or a substituted or unsubstituted aryl group, and Y represents a nonmetallic atom group for forming a basic nucleus of the dye together with the adjacent A and carbon atom.

Specific examples of $R_1$ is specifically described below. The alkyl groups is preferably a linear, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, a linear alkyl group having from 1 to 12 carbon atoms, a branched alkyl group having from 3 to 12 carbon atoms and a cyclic alkyl group having from 5 to 10 carbon atoms are more preferred.

The substituent of the substituted alkyl group is a monovalent nonmetallic atom group exclusive of hydrogen. Preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl--N-arylcarbamoyl group, an alkylsulfinyl group, an arylsulfinyl group, an alkylsulfonyl group, an arylsulfonyl group, a sulfo group (—SO$_3$H) and a conjugate base group thereof (hereinafter called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and a conjugate base group thereof (hereinafter called a phosphonate group), a dialkylphosphono group (—$_{PO3}$(alkyl)$_2$), a diarylphosphono group (—PO$_3$(aryl)$_2$), an alkylarylphosphono group (—PO$_3$(alkyl) (aryl)), a monoalkylphosphono group (—PO$_3$H (alkyl)) and a conjugate base group thereof (hereinafter called an alkylphosphonate group), a monoarylphosphono group (—PO$_3$H(aryl)) and a conjugate base group thereof (hereinafter called an arylphosphonate group), a phosphonooxy group (—OPO$_3$H$_2$) and a conjugate base group thereof (hereinafter called a phosphonate oxy group), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl) (aryl)), a monoalkylphosphonooxy group (—OPO$_3$H(alkyl)) and a conjugate base group thereof (hereinafter called an alkylphosphonate oxy group), a monoarylphosphonooxy group (—OPO$_3$H(aryl)) and a conjugate base group thereof (hereinafter called an arylphosphonate oxy group), a cyano group, a nitro group, an aryl group, a heteroaryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonate phenyl group, a phosphonophenyl group and a phosphohate phenyl group.

Examples of the heteroaryl group include a monocyclic or polycyclic aromatic ring group containing at least one of nitrogen, oxygen and sulfur atoms. The heteroaryl group is preferably a 5- or 6-membered aromatic substituent such as furan, pyrrole and pyridine.

Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group and a trimethylsilylethynyl group. In the acyl group (G$_1$CO—), G$_1$ is hydrogen or the above-described alkyl or aryl group. Among these substituents, preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonate group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonate group, a dialkylphosphono group, a diarylphosphono group, a monoalkylphosphoro group, an alkylphosphonate group, a monoarylphosphono group, an arylphosphonate group, a phosphonooxy group, a phosphonate oxy group, an aryl group and an alkenyl group.

The alkylene group in the substituted alkyl group includes a divalent organic residue resulting from eliminating any one of hydrogen atoms on the above-described alkyl group having from 1 to 20 carbon atoms, and preferred are a linear alkylene group having from 1 to 12 carbon atoms, a branched alkylene group having from 3 to 12 carbon atoms and a cyclic alkylene group having from 5 to 10 carbon atoms.

Specific examples of the substituted alkyl group preferred as $R_1$ obtained by combining the above-described substituent and the alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropyl-carbamoylmethyl group, an N-(methoxyphenyl) carbamoylethyl group, an N-methyl-N-(sulfophenyl) carbamoylmethyl group, a sulfobutyl group, a sulfonate butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonate hexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenyl-methyl group, a 2-propynyl group, a 2-butynyl group and a 3-butynyl group.

The aryl group preferred as $R_1$ includes a condensed ring formed by from 1 to 3 benzene rings and a condensed ring formed by a benzene ring and a 5-membered unsaturated ring. Specific examples thereof include a phenyl group, a naphthyl group, an anthryl group, a phenanthryl group, an indenyl group, an acehaphthenyl group and a fluorenyl group. Among these, a phenyl group and a naphthyl group are preferred.

The substituted aryl group preferred as $R_1$ includes those having a monovalent nonmetallic atom group exclusive of hydrogen as a substituent on the ring-forming carbon atoms of the above-described aryl group. Preferred examples of the substituent include the above-described alkyl groups, substituted alkyl groups and substituents for the substituted alkyl group. Preferred specific examples of the substituted aryl group include a biphenyl group, a tolyl group, a xylyl group, a mesityl group, a cumenyl group; a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylamino-phenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxy-phenyl) carbamoylphenyl group, an N-methyl-N-(sulfophenyl)-carbamoylphenyl group, a sulfophenyl group, a sulfonatephenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)-sulfamoylphenyl group, a phosphonophenyl group, a phosphonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allyl group, a 1-propenylmethyl group, 2-butenyl group, a 2-methylallylphenyl group, a 2-methylpropenylphenyl group, a 2-propynylphenyl group, a 2-butynlphenyl group and a 3-butynylphenyl group.

Y in formula (II) is described below. Y represents a nonmetallic atom group necessary for forming a heterocyclic ring together with A and the adjacent carbon atom. Examples of the heterocyclic ring include 5-, 6- or 7-membered, preferably 5-, or 6-membered, nitrogen- or sulfur-containing heterocyclic rings.

Examples of the nitrogen-containing heterocyclic ring include those known to constitute the basic nucleus of merocyanine dyes described, for example, in L. G. Brooker et al., *J. Am. Chem. Soc.*, 73, 5326–5358 (1951) and reference publications recited therein, and any of those compounds can be suitably used. Specific examples thereof include thiazoles-(e.g., thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole), benzothiazoles (e.g., benzothiazole, 4-chlorobenzothiazole, 5-chlorobenzothiazole, 6-chlorobenzothiazole 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, 5-ethoxycarbonylbenzothiazole), naphthothiazoles (e.g., naphtho[1,2]thiazole, naphtho[2,1]-thiazole, 5-methoxynaphtho[2,1]thiazole, 5-ethoxynaphto-[2,1] thiazole, 8-methoxynaphtho(1,2]thiazole, 7-methoxynaphtho[1,2]thiazole), thianaphtheno-7', 6', 4,5-thiazoles (e.g., 4'-methoxythianaphtheno-7', 6', 4,5-thiazole), oxazoles (e.g., 4-methyloxazole, 5-methyloxazole, 4-phenyloxazole, 4,5-diphenyloxazole, 4-ethyloxazole, 4,5-dimethyloxazole, 5-phenyloxazole), benzoxazoles (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, 6-hydroxybenzoxazole), naphthoxazoles (e.g., naphth-[1,2]oxazole, naphth[2,1]oxazole), selenazoles (e.g., 4-methylselenazole, 4-phenylselenazole), benzoselenazoles (e.g., benzoselenazole, 5-chlorobenzoselenazole, 5-methoxybenzoselenazole, 5-hydroxybenzoselenazole, tetrahydrobenzoselenazole), naphthoselenazoles (e.g., naphtho[1,2]selenazole, naphtho[2,1]selenazole), thiazolines (e.g., thiazoline, 4-methylthiazoline), 2-quinolines (e.g., quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline), 4-quinolines (e.g., quinoline, 6-methoxyquinoline, 7-methylquinoline, 8-methylquinoline), 1-isoquinolines (e.g., isoquinoline, 3,4-dihydroisoquinoline), 3-isoquinolines (e.g., isoquinoline), benzimidazoles (e.g., 1,3-diethylbenzimidazole, 1-ethyl-3-phenylbenzimidazole), 3,3-dialkylindolenines (e.g., 3,3-dimethylindolenine, 3,3,5-trimethylindolenine, 3,3,7-trimethylindolenine), 2-pyridines (e g., pyridine, 5-methylpyridine), and 4-pyridines (e.g., pyridine).

Examples of the sulfur-containing heterocyclic ring include diol partial structures in the dyes described, for example, in JP-A-3-296759 (the term "JP-A" as used herein means an "unexamined published Japanese patent application").

Specific examples thereof include benzodithiols (e.g., benzodithiol, 5-t-butylbenzodithiol, 5-methylbenzodithiol), naphthodithiols (e.g., naphtho[1,2]dithiol, naphtho-[2,1]dithiol), dithols (e.g., 4,5-dimethyldithiols, 4-phenyldithiols, 4-methoxycarbonyldithiols, 4,5-dimethoxycarbonylbenzodithiols, 4,5-ditrifluoromethyldithiol, 4,5-dicyanodithiol, 4-methoxycarbonylmethyldithiol, 4-carboxymethyldithiol).

The dyes where Y in formulae (II) and (II-2) to (II-4) is the above-described nitrogen- or sulfur-containing heterocyclic ring formed by A and the adjacent carbon atom and the ring has a structure represented by the following partial structural formula (II-A) are particularly preferred because those dyes give a photosensitive composition having high sensitization activity and also very excellent storage stability.

Partial Structural Formula (II-A)

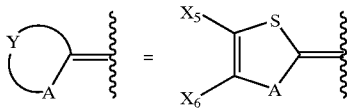

wherein A has the same meaning as in formula (II), $X_5$ and $X_6$ each independently represents a substituted or unsubstituted alkyl group, an aryl group or a heteroaryl group, and $X_5$ and $X_6$ may be combined with each other to form a 5-, 6- or 7-membered ring. Specific examples of $X_5$ and $X_6$ include substituted or unsubstituted alkyl and aryl groups described above as examples of $R_2$.

$X_1$ and $X_2$ in formula (II) are specifically described below. $X_1$ and $X_2$ each independently represents a monovalent nonmetallic atom group. Examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylaminogroup, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-arykl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diaryicarbamoyl group, an N-alkyl-N-arylcarbamoyl group, an alkylsulfinyl group, an arylsulfinyl group, an alkylsulronyl group, an arylsulfonyl group, a sulfo group (—$SO_3H$) and a conjugate base group thereof (hereinafter called a sulfonate group), an alkoxysulfonyl group, an aryloxysulrfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter called a phosphonate group), a dialkylphosphono group (—$PO_3(alkyl)_2$), a diarylphosphono group (—$PO_3(aryl)_2$), an alkylarylphosphono group (—$PO_3$(alkyl) (aryl)), a monoalkylphosphono group (—$PO_3H$(alkyl)) and a conjugate base group thereof (hereinafter called an alkylphosphonate group), a monoarylphosphono group (—$PO_3H$(aryl)) and a conjugate base group thereof (hereinafter called an arlylphosphonate group), a phosphonooxy group (—$OPO_3H_2$) and a conjugate base group thereof (hereinafter called a phosphonate oxy group), a dialkylphosphonooxy group (—$OPO_3(alkyl)_2$), a diarylphosphonooxy group (—$OPO_3(aryl)_2$), an alkylarylphosphonooxy group (—$OPO_3$(alkyl) (aryl)), a monoalkylphosphonooxy group (—$OPO_3H$(alkyl)) and a conjugate base group thereof (hereinafter called an alkylphosphonate oxy group), a monoarylphosphonooxy group (—$OPO_3H$(aryl)) and a conjugate base group thereof (hereinafter called an arylphosphonate oxy group), a cyano group, a nitro group, a substituted or unsubstituted aryl group, a heteroaryl group, an alkenyl group and an alkynyl group. Specific examples thereof include those described above with respect to $R_1$.

$X_1$ and $X_2$ may be combined to form acidic nuclei of the merocyanine dyes described in L. G. Brooker et al., J. Am. Chem. Soc., 73, 5326–5358 (1951).

Specific examples of the acidic nucleus include 1,3-dicarbonyl nuclei (e.g., 1,3-indanedione, 1,3- cyclohexanedione, 5,5-dimethylcyclohexanedione, 1,3-dioxane-4,6-dione), pyrazolinone nuclei (e.g., 3-methyl-1-phenyl-2-pyrazolin-5-one, 1-phenyl-2-pyrazolin-5-one, 1-(2-benzothiazolyl)-3-methyl-2-pyrazolin-5-one), isooxazolinone nuclei (e.g., 3-phenyl-2-isooxazolin-5-one, 3-methyl-2-isooxazolin-5-one), oxyindole nuclei (e.g., 1-alkyl-2,3-dihydro-2-oxyindole), 2,4,6-trioxohexahydropyrimidine nuclei (for example, a barbituric acid, a 2-thiobarbituric acid, and an N-substituent derivative thereof, e.g., 1,3-diethylbarbituric acid, 1,3-diethyl-2-thiobarbituric acid, 1,3-dibutylbarbituric acid, 1,3-dibutyl-2-thiobarbituric acid, 1,3-diphenylbarbituric acid, 1,3-diphenyl-2-thiobarbituric acid, 1,3-dimethoxycarbonylmethylbarbituric acid, 1,3-dimethoxycarbonylmethyl-2-thiobarbituric acid), 2-thio-2,4-thiazolidinedione nuclei (for example, rhodanine and an N-substituted derivative thereof, e.g., 3-methyl rhodanine, 3-ethyl rhodanine, 3-phenyl rhodanine, 3-allyl rhodanine, 3-benzyl rhodanine, 3-carboxymethyl rhodanine, 3-carboxyethyl rhodanine, 3-methoxycarbonylmethyl rhodanine, 3-hydroxyethyl rhodanine, 3-morpholinoethyl rhodanine), 2-thio-2,4-oxazolidinedione nuclei (namely, 2-thio-2,4-(3H,4H)-oxazoledione nuclei, e.g., 2-ethyl-2-thio-2,4-oxazolidinedione), thianaphthenone nuclei (e.g., 3(2H)-thianaphthenone, 3(2H)-thianaphthenone-1,1-dioxide), 2-thio-2,5-thiazolidinedione nuclei (e.g., 3-ethyl-2-thio-2,5-thiazolidinedione), 2,4-thiazolidinedione nuclei (e.g., 2,4-thiazolidinedione, 3-ethyl-2,4-thiazolidinedione, 3-phenyl-2,4-thiazolidinedione), thiazolidinedinone nuclei (e.g., 4-thiazolidinone, 3-ethyl-4-thiazolidinone, 2-ethylmercapto-4-thiazolidinone, 2-methylphenylamino-4-thiazolidinone), 2-imino-2-oxazolin-4-one nuclei (namely, pseudo-hydantoin nucleus), 2,4-imidazolidinedione nuclei (namely, hydantoin nuclei, e.g., 2,4-imidazolidinedione, 3-ethyl-2,4-imidazolidinedione, 1,3-diethyl-2,4-imidazolidinedione), 2-thio-2,4-imidazolidinedione nuclei (namely, thiohydantoin nuclei, e.g., 2-thio-2,4-imidazolidinedione, 3-ethyl-2-thio-2,4-imidazolidinedione, 1,3-diethyl-2-thio-2,4-imidazolidinedione), imidazolin-5-one nuclei (e.c., 2-propylmercapto-2-imidazolin-5-one), furan-5-one nuclei, 4-hydroxy-2(1H)-pyridinone nuclei (e.g., N-methyl-4-hydroxy-2(1H)-pyridinone, N-methyl-4-hydroxy-2(1H)-quinolinone, N-butyl-4-hydroxy-2(1H)-quinolinone), 4-hydroxy-2H-pyran-2-one nuclei (e.g., 4-hydroxycoumarin) and thioindoxyl nuclei (e.g., 5-methylthioindoxyl). These acidic nuclei each may have a substituent.

Out of the dyes having the above-described partial structure constituted by $X_1$ and $X_2$ those having the following partial structural formula (II-B), (II-C) or (II-D) give a novel and high-sensitivity photosensitive composition.

Partial Structural Formulae (II-B), (II-C) and (II-D)

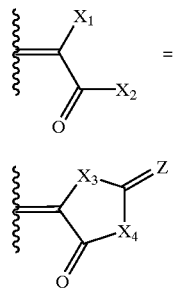

(II-B)

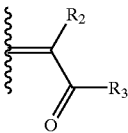

(II-C)

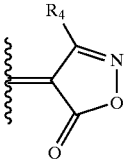

(II-D)

wherein $X_3$, $X_4$ and $Z$ each independently represents O atom, S atom or $NR_3$, $R_3$ represents a substituted or unsubstituted alkyl group or a substituted or unsubstituted aryl group, $R_1$ represents hydrogen atom, a substituted or unsubstituted alkyl group, a substituted or unsubstituted alkoxy group, an aryloxy group, an alkylthio group, an arylthio group, an alkylamino group or an arylamino group, $R_3$ represents hydrogen atom, a substituted or unsubstituted alkyl group, an aryl group, a heteroaryl group, an alkoxy group, an aryloxy group, an alkylthio group, an arylthio group, an alkylamino group or an arylamino group, and $R_4$ represents hydrogen atom, a substituted or unsubstituted alkyl group, an aryl group or a heteroaryl group. Specific examples of respective substituents described above may be optionally used.

Examples of the sensitizing dye for use in the present invention are more specifically shown below by Chemical Formulae (D201) to (D253), however, the present invention is by no means limited by the following chemical formulae and any sensitizing dye may be suitably used in the present invention as long as it satisfies the above-described constitutional requirements.

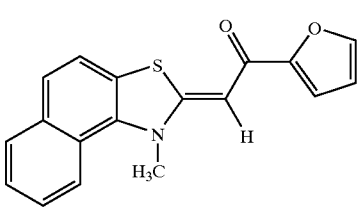

(D201)

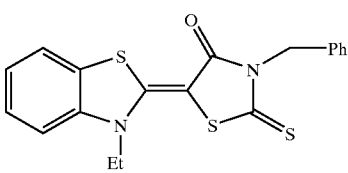

(D202)

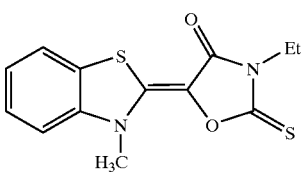

(D203)

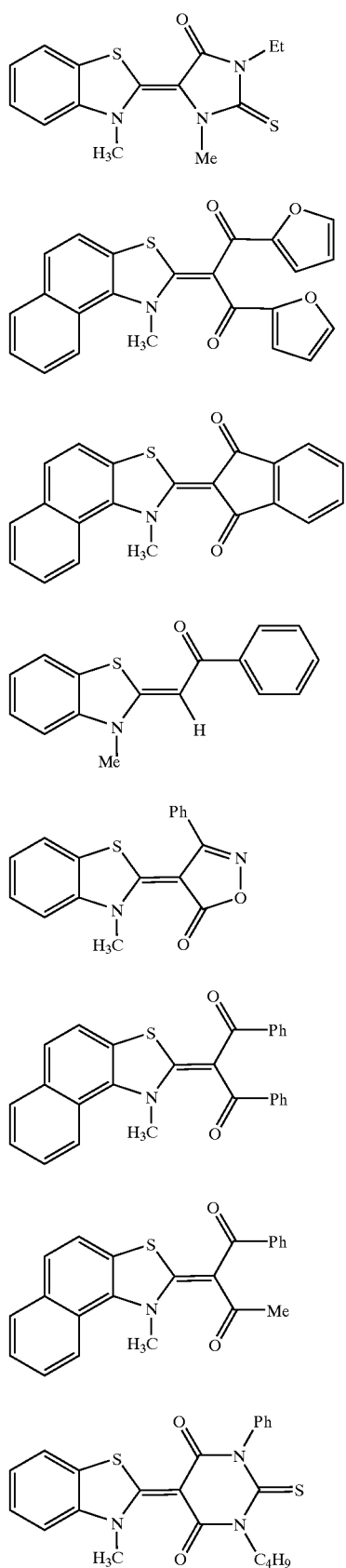
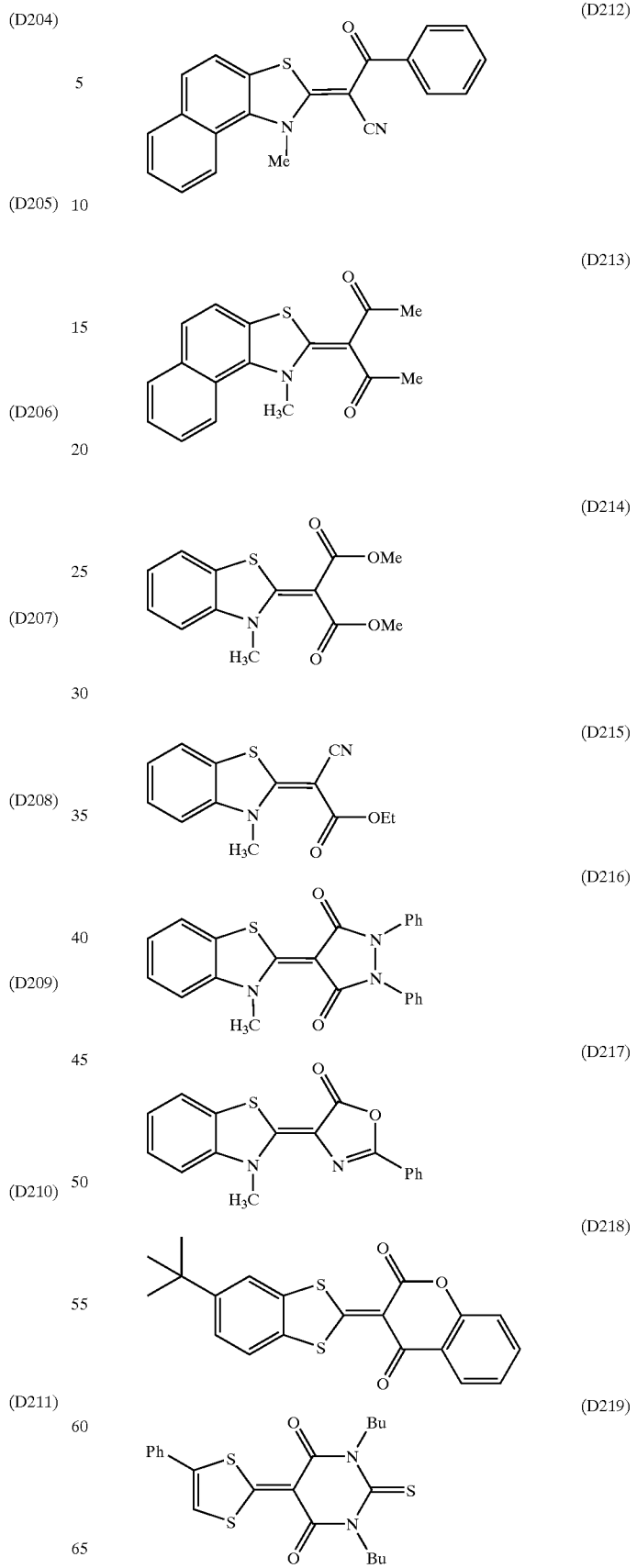

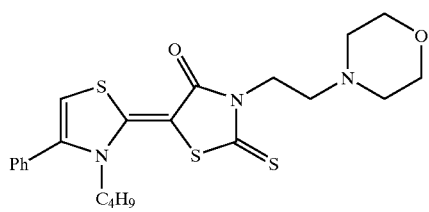 (D220)
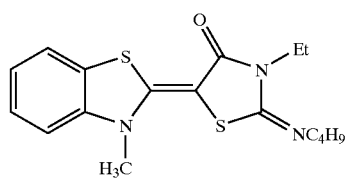 (D221)
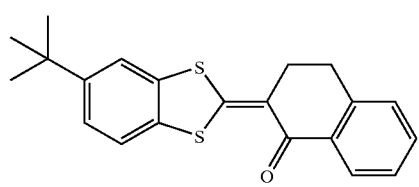 (D222)
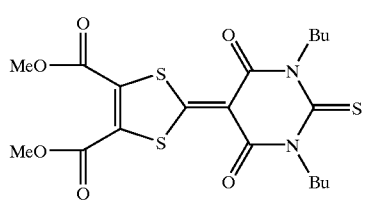 (D223)
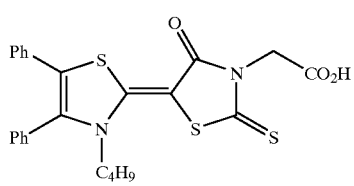 (D224)
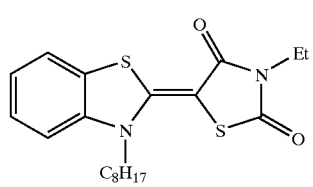 (D225)
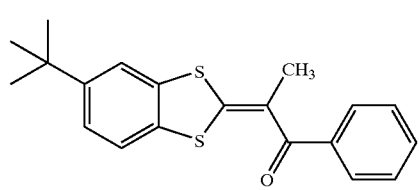 (D226)
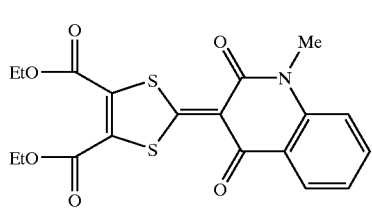 (D227)
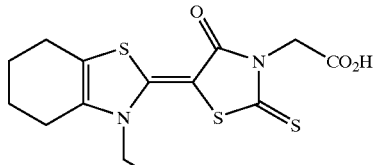 (D228)
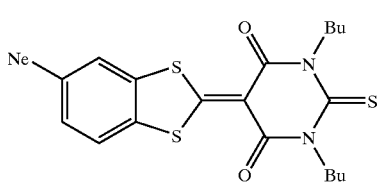 (D229)
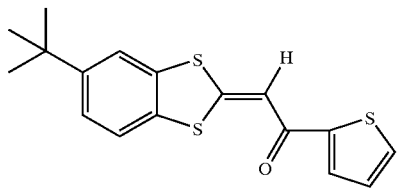 (D230)
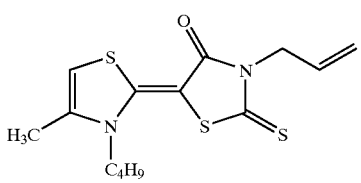 (D231)
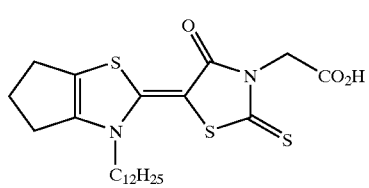 (D232)
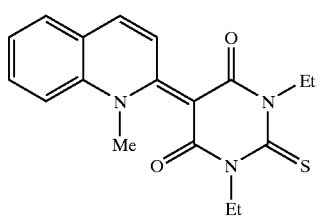 (D233)
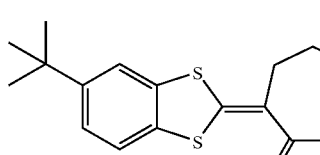 (D234)
 (D235)

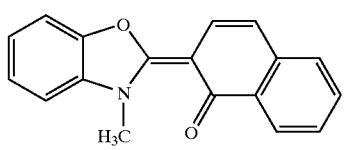 (D236)
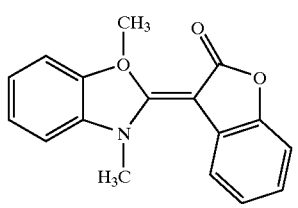 (D237)
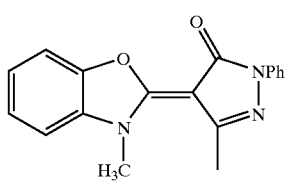 (D238)
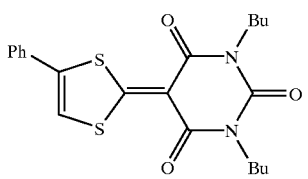 (D239)
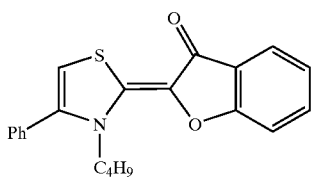 (D240)
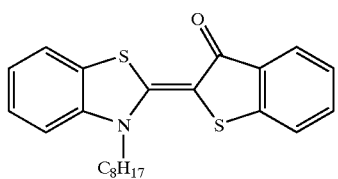 (D241)
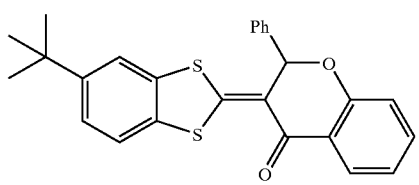 (D242)
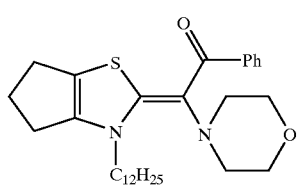 (D243)
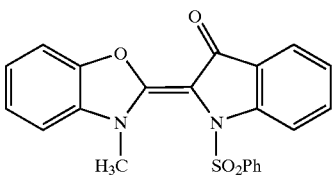 (D244)
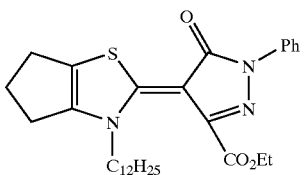 (D245)
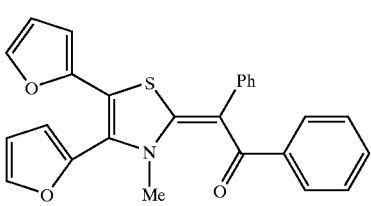 (D246)
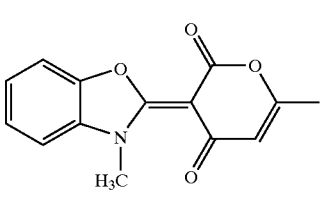 (D247)
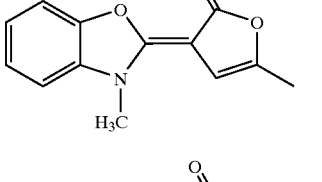 (D248)
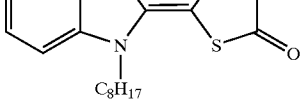 (D249)
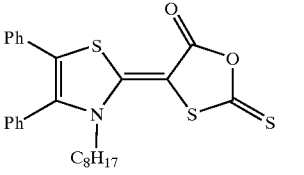 (D250)
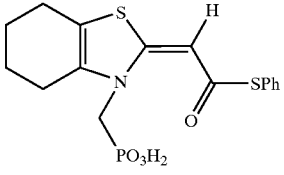 (D251)

-continued

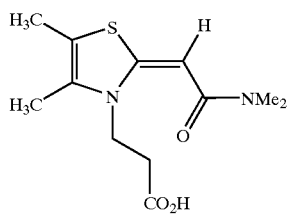

(D252)

The sensitizing dyes represented by formulae (II) and (II-2) to (II-4) of the present invention can be synthesized by referring to the methods described in F. M. Hamer et al., *The Cyanine Dyes and Related Compounds*, pp. 511–611 (1964), and Kai Arne Jensen, Lars Henriksen et al., *ACTA CHEMICA SCANDINAVICA*, Vol. 22, pp. 1107–1128 (1968).

The sensitizing dye for use in the present invention, in case where it is used for a photosensitive layer of a lithographic printing plate, may be subjected to various chemical modifications so as to improve the property of the photosensitive layer. For example, a sensitizing dye may be bonded to an addition polymerizable compound structure (e.g., acryloyl group, methacryloyl group) by covalent bonding, ion bonding, hydrogen bond or the like, to increase the strength of the exposure layer or prevent unnecessary precipitation of the dye from the layer after exposure. Also, a sensitizing dye may be bonded to a titanocene compound or other radical-generating part (for example, a reduction decomposable site such as halogenated alkyl, onium, peroxide, biimidazole, onium and biimidazole, or oxidation cleaving site such as borate, amine, trimethylsilylmethyl, carboxymethyl, carbonyl and imine) which will be described later, to remarkably elevate photosensitivity particularly in the state of the initiation system being in a low concentration. In order to increase suitability for the processing with an (alkali) aqueous developer with which the photosensitive layer of the present invention is preferably used, it is effective to introduced a hydrophilic site (for example, an acid group or a polar group, such as carboxyl group or an ester thereof, sulfonic acid group or an ester thereof, or ethylene oxide group). In particular, the ester-type hydrophilic group has advantageous property such that compatibility in the photosensitive layer is excellent because of its relatively hydrophobic structure and nevertheless, its hydrophilicity increases in the developer because an acid group is produced by the hydrolysis. In addition, an appropriate substituent may be introduced so as to improve the compatibility in the photosensitive layer, prevent the precipitation of crystals or the like. For example, in a certain photosensitive system, an unsaturated bond such as aryl group or allyl group may be very effective in the improvement of compatibility. By introducing a branched alkyl structure or the like, a steric hindrance is allowed to be present between the dye π planes and thereby the precipitation of crystals can be greatly prevented. By introducing a phosphonic acid group, an epoxy group, a trialkoxysilyl group or the like, the adhesion to an inorganic material such as metal or metal oxide can be improved. Furthermore, polymerization or the like of the sensitizing dye may also be used according to the purpose.

Details on use of the sensitizing dye, namely, which structure to be used, whether to be used individually or in combination of two or more thereof, in which amount to be used or the like, can be appropriately selected according to the designed performance of the final photosensitive material. For example, by using two or more kinds of sensitizing dyes, compatibility with the photosensitive layer can be increased. In selecting the sensitizing dye, the molar absorption coefficient at the oscillation wavelength of the light source used is an important factor in addition to the photosensitivity. By using a dye having a large molar absorption coefficient, the dye can be used in a relatively small amount and this is advantageous in profitability and also in the physical properties of the photosensitive layer. The absorbance has a great effect on the sensitivity of photosensitive layer, the resolution and the physical properties of the exposure layer, therefore, by taking account of these, the amount of the sensitizing dye used is appropriately selected. For example, if the absorbance is as low as 0.1 or less, the sensitivity decreases and furthermore, by the effect of halation, low resolution results. However, for hardening a layer having a large thickness of, for example, 5 μm or more, such low absorbance may be rather advantageous in attaining a high degree of hardening. On the other hand, if the absorbance is as high as 3 or more, a majority of light is absorbed on the surface of photosensitive layer and hardening in the more inside portion is inhibited. In the case of use, for example, as a printing plate, this gives rise to insufficient layer strength or deficient adhesion to the substrate. In the case of use as a printing plate where the layer thickness is relatively large, the amount of the sensitizing dye added is preferably set so that the photosensitive layer can have absorbance of from 0.1 to 1.5, preferably from 0.25 to 1. More specifically, in the case of use as a printing plate, the sensitizing dye is usually used in an amount of from 0.05 to 30 parts by weight, preferably from 0.1 transfer layer 20 parts by weight, more preferably from 0.2 to 10 parts by weight, per 100 parts by weight of the photosensitive layer components.

(A2) Titanocene Compound

The titanocene compound used as a photopolymerizable initiation system in the photosensitive composition of the present invention may be any titanocene compound as long as it can generate active radicals in the presence of the above-described sensitizing dye upon irradiation of light. For example, known compounds described in JP-A-59-152396, JP-A-61-151197, JP-A-63-41483, JP-A-63-41484, JP-A-2-249, JP-A-2-291, JP-A-3-27393, JP-A-3-12403 and JP-A-6-41170 may be appropriately selected and used.

Specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl (hereinafter referred to as "T-1"), dicyclopentadienyl-Ti-bis-2,3,5,6-tetrafluorophen-1-yl, di-cyclopentadienyl-Ti-bis-2,4,6-trifluorophen-1-yl, dicyclopentadiepnyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcylopentadienyl-Ti-bis-2,3,5,6-tetrafluorophen-1-yl, dimethylcyclopentadienyl-Ti-bis-2,4-difluorophen-1-yl and bis-(cyclopentadienyl)-bis(2,6-difluoro-3-(pyr-1-yl)phenyl)-titanium (hereinafter referred to as "T-2")

Similarly to the above-described sensitizing dye, the titanocene compound for use in the present invention may also be subjected to various chemical modifications so as to improve the properties of photosensitive layer. For example, bonding with a sensitizing dye, an addition polymerizable unsaturated compound or other radical-generating part, introduction of a hydrophilic site, introduction of a substituent so as to improve compatibility or prevent precipitation of crystals, introduction of a substituent so as to improve adhesion, polymerization, or the like may be used.

Similarly to the above-described addition polymerizable compound and sensitizing dye, the use method of the titanocene compound may also be appropriately and freely designed according to the desired performance of photosensitive material. For example, two or more kinds of the titanocene compounds may be used in combination to increase the compatibility with the photosensitive layer. A larger amount of titanocene compound used is advantageous from the standpoint of photosensitivity and a sufficiently high sensitivity can be obtained by using the titanocene compound in an amount of from 0.5 to 80 parts by weight, preferably from 1 to 50 carts by weight, per 100 parts by weight of the photosensitive layer components. On the other hand, when a white lamp such as yellow is used, the amount of titanocene compound used is preferably smaller from the standpoint of fogging property due to light in the vicinity of 500 nm and when the titanocene compound is used in combination with the sensitizing dye for use in the present invention, a sufficiently high photosensitivity can be obtained with an amount reduced to 6 parts by weight or less, even to 1.9 parts by weight or less, yet even to 1.4 parts by weight or less.

B. Photosensitive Composition

The photoinitiation system in the photosensitive composition of the present invention may be used in combination with a radical reactive or acid reactive composition in, for example, photosensitive resin materials or photorecording materials over a wide range, however, excellent effects of the system can be brought out particularly when it is used in the following photosensitive (photopolymerizable) composition. More specifically, the photopolymerizable composition of the present invention preferably contains (B) an addition polymerizable compound having at least one ethylenically unsaturated double bond (hereinafter referred to as an addition polymerizable compound)" in addition to the "A. photoinitiation system". In the case of application to a lithographic printing plate, the photopolymerizable composition further contains, if desired, (C) a binder polymer. These components are described in detail below.

(B) Addition Polymerizable Compound

The addition polymerizable compound having at least one ethylenically unsaturated double bond, for use in the present invention is selected from the compounds having at least one, preferably two, terminal ethylenically unsaturated bond. These compounds are well known in the art and can be used in the present invention without any particular limitation. These compounds have a chemical form of monomer, prepolymer (e.g., dimer, trimer, oligomer) or a mixture or copolymer thereof. Examples of the monomer and the mixture thereof include unsaturated carboxylic acids (e.g., acrylic acid, methacrylic acid, itaconic acid, crotonic acid, isocrotonic acid, maleic acid), and esters and amides thereof. Among these, an ester of an unsaturated carboxylic acid and an aliphatic polyhydric alcohol compound, and an amide of an unsaturated carboxylic acid and an aliphatic polyhydric amine compound are preferred.

Also, an addition reactant of an unsaturated carboxylic acid ester or amide having a nucleophilic substituent such as a hydroxyl group, an amino group or a mercapto group to a monofunctional or polyfunctional isocyanate or epoxy, and a dehydrating condensation reactant with a monofunctional or polyfunctional carboxylic acid may be suitably used. Furthermore, an addition reactant of an unsaturated carboxylic acid ester or amide having an electrophilic substituent such as an isocyanate group or an epoxy group to a monofunctional or polyfunctional alcohol, amine or thiol, and a substitution reactant of an unsubstituted carboxylic acid-ester or amide having a splitting-off substituent such as a halogen group or a tosyloxy group with a monofunctional or polyfunctional alcohol, amine or thiol may be suitably used. In addition, compounds obtained by displacing the unsaturated carboxylic acid with unsaturated phosphonic acid, styrene or vinyl ether may be used.

Specific examples of the ester monomer of an aliphatic polyhydric alcohol compound and an unsaturated carboxylic acid include, as the acrylic acid ester, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer.

Examples as the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)-phenyl]dimethylmethane and bis[p-(methacryloyloxyethoxy)-phenyl] dimethylmethane.

Examples as the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples as the crotonic acid ester include ethylene glycol dicrotonate, tetramethylene glycol dicrotonate, pentaerythritol dicrotonate and sorbitol tetradicrotonate.

Examples as the isocrotonic acid ester include ethylene glycol diisocrotonate, pentaerythritol diisocrotonate and sorbitol tetraisocrotonate.

Examples as the maleic acid ester include ethylene glycol dimaleate, triethylene glycol dimaleate, pentaerythritol dimaleate and sorbitol tetramaleate Other examples of the ester which can be suitably used include aliphatic alcohol-base esters described, for example, in JP-B-46-27926 (the term "JP-B" as used herein means an "examined Japanese patent publication"), JP-B-51-47334 and JP-A-57-196231, esters having an aromatic skeleton described in JP-A-59-5240, JP-A-59-5241 and JP-A-2-226149, and esters having an amino group described in JP-A-1-165613.

The above-described ester monomers may also be used as a mixture thereof.

Specific examples of the amide monomer or an aliphatic polyhydric amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriamine-triasacrylamide, xylylenebisacrylamide, xylylenebis-methacrylamide.

Other preferred examples of the amide-base monomer include those having a cyclohexylene structure, described in JP-B-54-21726.

Also, an urethane-base addition polymerizable compound produced using the addition reaction of an isocyanate and a hydroxyl group may be suitably used and specific examples thereof include a vinylurethane compound having two or more polymerizable vinyl groups in one molecule resulting from adding a vinyl monomer having a hydroxyl group represented by the following formula (2) to a polyisocyanate compound having two or more isocyanate.groups in one molecule described, for example, in JP-B-48-41708:

$$CH_2=C(R)COOCH_2CH(R')OH \quad (2)$$

wherein R and R' each represents H or $CH_3$.

Furthermore, urethane acrylates described in JP-A-51-37193, JP-B-2-32293 and JP-B-2-16765, and urethane compounds having an ethylene oxide-base skeleton, described in JP-B-58-49860, JP-B-56-17654, JP-B-62-39417 and JP-B-62-39418, may be suitably used.

In addition, by using am addition polymerizable compound having an amino or sulfide structure within the molecule, described in JP-A-63-277654, JP-A-63-260909 and JP-A-1-105238, a photopolymerizable composition capable of exhibiting very high photosensitization speed may be obtained.

Other examples include polyester acrylates and epoxy acrylates obtained by reacting an epoxy resin with a (meth) acrylic acid, described in JP-A-48-64183, JP-B-49-43191 and JP-B-52-30490. Also, specific unsaturated compounds described in JP-B-46-43946, JP-B-1-40337 and JP-B-1-40336 and vinylphosphonic acid-base compounds described in JP-A-2-25493 may be used. Depending on the case, the structure having a perfluoroalkyl group described in JP-A-61-22048 may be suitably used. Furthermore, those described as a photo-curable monomer or oligomer in *Nippon Secchaku Kyokai-shi (Journal of Japan Adhesive Society)*, Vol. 20, No. 7, pp. 300–308 (1984) may be used.

The particulars on use of these addition polymerizable compounds, namely, which structure to be used, whether to be used individually or in combination, in which amount to be used or the like, may be freely determined according to the performance designed. For example, the conditions are selected from the following standpoint. In view of the photosensitization speed, a structure having a large content of unsaturated groups is preferred and in many cases, bifunctional or greater functional compounds are preferably used. In order to increase the strength of image area, namely, cured film, trifunctional or greater functional compounds are preferred. Also, by using in combination compounds different in the function number or polymerizable group (e.g., acrylic acid ester, methacrylic acid ester, styrene-base compound, vinyl ether-base compound), both the photosensitivity and the strength can be effectively controlled. Compounds having a large molecular weight or having high hydrophobicity give good photosensitization speed and high layer strength, however, these may be disadvantageous in some cases because of their development speed or precipitation in the developer. The selection and use method of addition polymerizable compound are important factors also in view of compatibility and dispersibility with other components (e.g., binder polymer, initiator, coloring agent) in the photosensitive layer. For example, depending on the case, the compatibility may be improved by using a low purity compound or using two or more compounds in combination. For the purpose of improving adhesion to support, overcoat layer or the like, a specific structure may be selected. A larger ratio of the addition polymerizable compound mixed in the photosensitive layer is advantageous in view of sensitivity, however, if the ratio is excessively large, undesirable phase separation may occur or there may arise a problem due to adhesive property of the photosensitive layer in the production process (for example, production failure attributable to the transfer or adhesion of photosensitive components) or a problem such as occurrence of the compound precipitating from the developer. In this meaning, the ratio of addition polymerizable compound mixed is in many cases from 5 to 80 wt %, preferably from 25 to 75 wt %, based on all components.in the composition. The addition polymerizable compounds may be used either individually or in combination of two or more thereof. With respect to the use method thereof, an appropriate structure, mixing or amount added may be freely selected by taking account of the degree of polymerization inhibition to oxygen, the resolution, the fogging, the change in the refractive index, the surface adhesion and the like. Depending on the case, a layer structure or coating method such as undercoat or overcoat may also be used.

(C) Binder Polymer

At the application to a lithographic printing plate which is a preferred practical embodiment of the present invention, the photosensitive layer preferably further contains a binder polymer. The binder contained is preferably a linear organic high molecular polymer. Any "linear organic high molecular polymer" may be used, however, a water- or alkalescent water-soluble linear organic high molecular polymer capable of water development or alkalescent water development or a swelling linear organic high molecular polymer is preferably selected. The linear organic high molecular polymer is not only used as a film-forming agent but also as a water, alkalescent water or organic solvent developer and is selected according to the use end. For example, when a water-soluble organic high molecular polymer is used, water development can be performed. Examples of the linear organic high molecular polymer include addition polymers having a carboxylic acid group on the side chain, such as methacrylic acid copolymers, acrylic acid copolymers, itaconic acid copolymers, crotonic acid copolymers, maleic acid copolymers and partially esterified maleic acid copolymers described in JP-,-59-44615, JP-B-54-34327, JP-B-58-12577, JP-B-54-25957, JP-A-54-92723, JP-A-59-52036 and JP-A-59-71048. Also, acidic cellulose derivatives similarly having a carboxylic acid group on the side chain may be used. In addition, those obtained by adding a cyclic acid anhydride to an addition polymer having a hydroxyl group are useful.

In particular, (benzyl (meth)acrylate/(meth)acrylic acid/ another addition polymerizable vinyl monomer, if desired) copolymers and (allyl (meth)acrylate/(meth)acrylic acid/ another addition polymerizable vinyl monomer, if desired) copolymers have an excellent balance among layer strength, sensitivity and developability, and are suitably used.

Furthermore, urethane-base binder polymers containing an acid group described in JP-B-7-12004, JP-A-7-120041, JP-A-7-120042, JP-A-8-12424, JP-A-63-287944, JP-A-63-287947, JP-A-1-271741 and Japanese Patent Application No. 10-116232 have very excellent strength and are advantageous in view of press life and suitability for low intensity exposure.

Other than those, polyvinyl pyrrolidone, polyethylene oxide and the like are useful as the water-soluble linear organic polymer. For the purpose of increasing the strength of hardened layer, an alcohol-soluble nylon, a polyether of 2,2-bis-(4-hydroxyphenyl)propane with epichlorohydrin, and the like are useful. The amount of the linear organic high molecular polymer blended in the entire composition may be freely selected. However, if the amount added exceeds 90 wt %, disadvantageous results may come out in view of the strength of image formed. The amount of the linear organic. high molecular polymer blended is preferably from 30 to 85 wt %. The weight ratio of the photopolymerizable compound having an ethylenically unsaturated double bond to the linear organic high molecular polymer is preferably from 1/9 to 7/3.

(D) Other Components

In the case of using the photosensitive composition of the present invention in the photosensitive layer of a lithographic printing plate, other components suitable for the use or production method thereof may be appropriately added to the photosensitive layer. Preferred additives are described below.

(D1) Co-Sensitizer

By using a certain kind of sensitizer (hereinafter referred to as a "co-sensitizer"), the sensitivity of the photosensitive layer may be further improved. The mechanism in the action of the co-sensitizer is not clearly known but considered to proceed based on the following chemical process in many cases. Various intermediate active seeds (e.g., radical, peroxide, oxidizing agent, reducing agent) generated in the process of photoreaction triggered by the light absorption of the above-described initiation system and subsequent addition polymerization reaction are presumed to react with the co-sensitizer to produce new active radicals. The active seeds can be roughly classified into (a) those which are reduced to produce active radicals, (b) those which are oxidized to produce active radicals and (c) those which react with a radical having lower activity and are converted into a highly active radical or act as a chain transfer agent. However, about the classes to which individual compounds belong, a common opinion is not established on many occasions.

(a) Compounds which are Reduced to Produce Active Radicals

Compounds Having Carbon-halogen Bond

The carbon-halogen bond is considered to cleave by the reduction to generate active radicals. Specific preferred examples of the compound include trihalomethyl-s-triazines and trihalomethyloxadiazoles.

Compounds Having Nitrogen-nitrogen Bond

The nitrogen-nitrogen bond is considered to cleave by the reduction to generate active radicals. Specific preferred examples of the compound include hexaaryl-biimidazoles.

Compounds Having Oxygen-oxygen Bond

The oxygen-oxygen bond is considered to cleave by the reduction to generate active radicals. Specific preferred examples of the compound include organic peroxides.

Onium Compounds

The carbon-hetero bond or oxygen-nitrogen bond is considered to cleave by the reduction to generate active radicals. Specific preferred examples of the compound include diaryliodoniums, triarylsulfoniums and N-alkoxy-pyridinium(azinium) salts.

Ferrocene, Iron Arene Complexes

Active radicals are produced by the reduction.

(b) Compounds which are Oxidized to Produce Active Radicals

Alkyl-ate Complexes

The carbon-hetero bond is considered to cleave by the oxidation to generate active radicals. Specific preferred examples of the compound include triarylalkyl borates.

Alkylamine Compounds

The C—X bond on carbon adjacent to nitrogen is considered to cleave by the oxidation to produce active radicals. X is preferably hydrogen atom, a carboxyl group, a trimethylsilyl group or a benzyl group. Specific examples of the compound include ethanolamines, N-phenylglycines and N-trimethylsilylmethylanilines.

Sulfur- or Tin-containing Compounds

Compounds resulting from displacing the nitrogen atom in the above-described amines with sulfur atom or tin atom can produce active radicals by the same action. Also, compounds having an S—S bond are known to undertake sensitization by the cleavage of S—S bond.

α-Substituted Methylcarbonyl Compounds

The carbonyl-α carbon bond is considered to cleave by the oxidation to produce active radicals. Also, those where the carbonyl is converted into an oxime ether exhibit the same action. Specific preferred examples of the compound include 2-alkyl-1-[4-(alkylthio)phenyl]-2-morpholino-pronone-1 and oxime ethers obtained by reacting 2-alkyl-1-[4-(alkylthio)phenyl]-2-morpholinopronone-1 with a hydroxyamine and then etherifying N—OH.

Sulfinates

Active radicals are produced by the reduction. Specific examples of the compound include sodium arylsulfinate.

(c) Compounds which React with a Radical to Convert Into a Highly Active Radical or Act as a Chain Transfer Agent Compounds having, for example, SH, PH, SiH or GeH within the molecule come under this class. These compounds provide hydrogen to a low-activity radical seed to produce a radical or are oxidized and then deprotonated to produce a radical. Specific examples of the compound include 2-mercaptobenzimidazoles.

Many of these co-sensitizers are more specifically described as additives for improving the sensitivity, for example, in JP-A-9-236913. Examples thereof are partly set forth below, however, the present invention is by no means limited thereto.

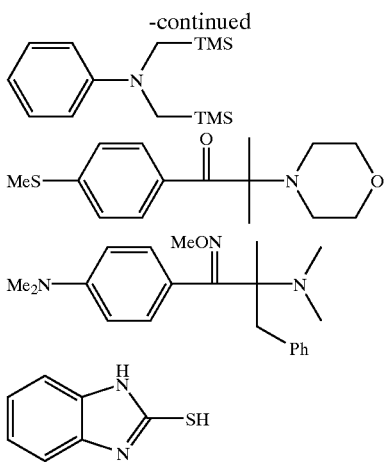

Similarly to the above-described sensitizing dye, these co-sensitizers can also be subjected to various chemical modifications so as to improve properties of the photosensitive layer. For example, bonding with a sensitizing dye or other radical-generating part such as titanocene and addition polymerizable unsaturated compound, introduction or a hydrophilic site, introduction of a substituent for improving compatibility or preventing the precipitation of crystals, introduction of a substituent for improving adhesion, polymerization and the like may be used.

These co-sensitizers may be used individually or in combination of two or more thereof. The amount of the co-sensitizer used is suitably from 0.05 to 100 parts by weight, preferably from 1 to 80 parts by weight, more preferably from 3 to 50 parts by weight, per 100 parts by weight of the compound having an ethylenically unsaturated double bond.

(D2) Polymerization Inhibitor

In the present invention, in addition to the above-described fundamental components, a slight amount of a thermal polymerization inhibitor is preferably added so as to prevent unnecessary thermal polymerization of the polymerizable compound having an ethylenically unsaturated double bond during the production or storage of the photosensitive composition. Examples of suitable thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol) and N-nitrosophenylhydroxyamine primary cerium salt. The amount of the thermal polymerization inhibitor added is preferably from about 0.01 to about 5 wt % based on the weight of the entire composition. Also, if desired, a higher fatty acid derivative such as a behenic acid and a behenic acid amide may be added and thereby dispersed unevenly on the surface of the photosensitive layer during the drying process after coating so as to prevent polymerization inhibition by oxygen. The amount of the higher fatty acid derivative added is preferably from about 0.5 to about 10 wt % of the entire composition.

(D3) Coloring Agent, Etc

Furthermore, a dye or a pigment may be added for the purpose of coloring the.photosensitive layer. By coloring the photosensitive layer, so-called aptitude for plate inspection, such as visibility as a printing plate after the plate-making or suitability for image density measuring apparatus, can be improved. Use of a pigment as the coloring agent is preferred because most of dyes reduce sensitivity of the photopolymerization system photosensitive layer. Specific examples of the coloring agent include pigments such as phthalocyanine pigment, azo pigment, carbon black and titanium oxide, and dyes such as Ethyl Violet, Crystal Violet, azo dye, anthraquinone dye and cyanine dye. The amount of the dye or pigment added is preferably from about 0.5 to about 5 wt % of the entire composition.

(D4) Other Additives

Also, an inorganic filler or other known additives such as a plasticizer and an ink receptivity agent capable of improving the inking property on the surface of the photosensitive layer may be added so as to improve physical properties of the hardened layer.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin. When a binder is used, the plasticizer.may be added in an amount of 10 wt % or less based on the total weight of the compound having an ethylenically unsaturated double bond and the binder.

Furthermore, an UV initiator, a thermal crosslinking agent and the like may also be added to intensify the effect of heating or exposure after the development performed for the purpose of improving the layer strength (press life) which will be described later.

In addition, in order to improve adhesion between the photosensitive layer and the support or to increase the development removability of unexposed photosensitive layer, an additive may be used or an interlayer may be provided. For example, a compound having a relatively strong interaction with the substrate, such as a compound having a diazonium structure or a phosphone compound, may be added or undercoated to improve the adhesive property and thereby enhance the press life. On the other hand, when a hydrophilic polymer such as polyacrylic acid or polysulfonic acid is added or undercoated, the developability of non-image area can be improved or the antifouling property can be increased.

At the time of coating the photosensitive composition of the present invention on a support, the photosensitive composition is used after dissolving it in an organic solvent of variety. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %.

The coverage of the photosensitive layer on a support has an effect mainly on the sensitivity of photosensitive layer, the developability and the strength/press life of the exposure layer, therefore, an appropriate coverage is preferably selected according to the use end. If the coverage is too small, deficient press life results, whereas if it is too large, sensitivity decreases, as a result, exposure takes a long time and moreover, a long development time is disadvantageously required. In the case of a scan-exposure lithographic printing plate as a principal object of the present invention, the coverage in terms of the weight after drying is preferably from about 0.1 to about 10 g/m$^2$, more preferably from 0.5 to 5 g/m$^2$.

Support

For obtaining a lithographic printing plate, which is one of the main objects of the photosensitive composition of the present invention, the photosensitive layer is preferably provided on a support having a hydrophilic surface. As the hydrophilic support, conventionally known hydrophilic supports used for the lithographic printing plate can be used without any limitation.

The support used is preferably a dimensionally stable, plate-like material. Examples thereof include paper, paper laminated with plastic (e.g., polyethylene, polypropylene, polystyrene), metal sheet (e.g., aluminum, zinc, copper), plastic film (e.g., cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate and polyvinyl acetal), and paper or plastic film laminated with or having evaporated thereon the above-described metal. The surface of the support may be subjected, if desired, to appropriate known physical or chemical treatments for the purpose of imparting hydrophilicity, improving strength, or the like.

In particular, paper, polyester film and aluminum plate are preferred, and among these, aluminum plate is preferred because it has good dimensional stability, is relatively inexpensive and can give a surface having excellent hydrophilicity and strength by applying a surface treatment according to the purpose. Also, a composite sheet obtained by bonding aluminum plate on polyethylene terephthalate film as described in JP-B-48-18327 is preferred.

The aluminum plate is preferably a plate of pure aluminum or alloy mainly comprising aluminum and containing a trace amount of hetero-elements. A plastic film having laminated or deposited thereon aluminum may also be used. Examples of the hetero-element contained in the aluminum alloy include silicon, iron, manganese, copper, magnesium, chromium, zinc, bismuth, nickel and titanium. The amount of the hetero-element contained in the alloy is at most 10 wt % or less. In the present invention, pure aluminum is particularly preferred, but since completely pure aluminum is difficult to produce in view of the refining technique, aluminum containing a slight amount of hetero-elements may be used. The composition of the aluminum plate applied to the present invention is not particularly limited and an aluminum plate conventionally known as a raw material may be appropriately used. The aluminum plate for use in the present invention has a thickness of approximately from 0.1 to 0.6 mm., preferably from 0.15 to 0.4 mm, more preferably from 0.2 to 0.3 mm.

In the case of a support having metal surface, particularly aluminum surface, is preferably subjected to a surface treatment such as surface roughening (graining), dipping in an aqueous solution of sodium silicate, potassium zirconate fluoride or phosphate, anodization or the like.

The surface roughening treatment of the aluminum plate is performed by various methods, for example, by a method of mechanically roughening the surface, by a method of electrochemically dissolving and roughening the surface of by a method of selectively dissolving the surface using chemical means. The mechanical roughening may be performed by a known method such as ball polishing, brush polishing, blast polishing or buff polishing. The electrochemical roughening may be performed in an electrolytic solution such as hydrochloric acid or nitric acid, while passing therethrough an alternate or direct current. These two roughening methods may also be used in combination as disclosed in JP-A-54-63902. If desired, a degreasing treatment may be performed, for example, with a surface active agent, an organic solvent, an alkaline aqueous solution or the like in advance of the surface roughening of aluminum plate so as to remove rolling oil on the surface.

An aluminum plate subjected to graining and then to dipping in an aqueous sodium silicate solution may be preferably used. An aluminum plate subjected to anodization and then to dipping in an aqueous alkali metal silicate solution described in JP-B-47-5125 is suitably used. The anodization is performed in an electrolytic solution by passing a current therethrough while assigning the anode to the aluminum plate. The electrolytic solution comprises an aqueous or non-aqueous solution of, for example, an inorganic acid such as phosphoric acid, chromic acid, sulfuric acid or boric acid, an organic acid such as oxalic acid or sulfamic acid, or a salt thereof, individually or in combination of two or more thereof.

The silicate electrodeposition described in U.S. Pat. No. 3,658,662 is also effective.

Furthermore, a surface treatment disclosed in JP-B-46-27411, JP-A-52-58602 and JP-A-52-30503, where a support subjected to electrolytic graining is combined with the above-described anodization and sodium silicate treatment, is also useful.

In addition, a support subjected in sequence to mechanical roughening, chemical etching, electrolytic graining, anodization and sodium silicate treatment disclosed in JP-A-56-28893 is also preferred.

The support subjected to the above-described treatments may be suitably undercoated with a water-soluble resin such as polyvinyl phosphonic acid, a polymer or copolymer having a sulfonic acid group on the side chain and polyacrylic acid, or with a water-soluble metal salt (e.g., zinc borate), a yellow dye or an amine salt.

A sol-gel processed substrate having conjugation-bonded thereto a functional group capable of addition reaction by radicals described in JP-A-7-159983 may also be suitably used.

Other suitable examples include a support obtained by providing a water-proof hydrophilic layer as the surface layer on an arbitrary support. Examples of the surface layer include a layer comprising an inorganic pigment and a binder described in U.S. Pat. No. 3,055,295 and JP-A-56-13168, a hydrophilic swelling layer described in JP-A-9-30744, and a sol-gel film comprising titanium oxide, polyvinyl alcohol or a silicate described in Japanese Published Unexamined International Application No. B-507727.

These hydrophilization treatments are applied not only to render the support surface hydrophilic but also to prevent harmful reaction of the photosensitive composition coated thereon, at the same time, to improve the adhesive property of the photosensitive layer.

Protective Layer

In a lithographic printing plate for scan exposure, which is a desirable embodiment of the invention of the lithographic printing plate using the photosensitive composition of the present invention, it is preferred to further provide a protective layer on the layer of the photosensitive composition because the exposure is usually performed in the atmosphere. The protective layer can prevent low molecular compounds such as oxygen and basic substances, which are present in the atmosphere and inhibit the image formation reaction generated in the photosensitive layer upon exposure, from mixing into the photosensitive latter, thereby enabling exposure in the atmosphere. In this meaning, the protective layer preferably has a low permeability to low molecular compounds such as oxygen. Furthermore, it is preferred for the protective layer to substantially not inhibit transmission of light for use in the exposure, to have excellent adhesive property to the photosensitive layer, and to be easily removed in the development process after the exposure. Various attempts have been heretofore made to attain such a protective layer and these are described in detail in U.S. Pat. 3,458,311 and JP-A-55-49729.

The material which can be used for the protective layer is preferably a water-soluble polymer compound having relatively excellent crystallinity. More specifically, water-soluble polymers such as polyvinyl alcohol, polyvinyl pyrrolidone, acidic celluloses, gelatin, gum arabic and polyacrylic acid are known. Among these, by using polyvinyl alcohol as a main component, most advantageous results can be obtained on the fundamental properties such as oxygen cutting property or development removability. The polyvinyl alcohol for use in the protective layer may be partially displaced by ester, ether or acetal as long as it contains an unsubstituted vinyl alcohol unit necessary for ensuring the oxygen cutting property and water solubility. Furthermore, a part of the polyvinyl alcohol may contain a copolymer component. The polyvinyl alcohol specifically includes those having a hydrolysis ratio of from 71 to 100.% and a molecular weight of from 300 to 2,400.

Specific examples thereof include PVA-105, PVA-110, PVA-117, PVA-17H, PVA-120, PVA-124, PVA-124H, PVA-CS, PVA-CST, PVA-FC, PVA-203, PVA-204, PVA-205, PVA-210, PVA-217, PVA-220, PVA-?24, PVA-217EE, PVA-217E, PVA-220E, PVA-224E, PVA-405, PVA-,420, PVA-613 and L-8, produced by Nuraray K.K. The components of the protective layer (e.g., selection of PVA, use of additives) and the coated amount thereof are selected by taking account of the fogging property, adhesion and scratch resistance in addition to the oxygen cutting property and development removability. In general, the higher the hydrolysis ratio of PVA used (the higher the content of unsubstituted vinyl alcohol unit in the protective layer) is and the larger the layer thickness is, the higher the oxygen cutting property is, and this is more advantageous in view of sensitivity. However, if the oxygen cutting property is extremely elevated, there arise problems. For example, unnecessary polymerization reaction may proceed during thee production or stock storage or unnecessary fogging or thickening of image line may occur at the image exposure. In addition to those properties, adhesion to the image area and the scratch resistance are also very important n view of handling of the plate. To speak more specifically, when a hydrophilic layer comprising a water-soluble polymer is laminated on a lipophilic polymer layer, layer separation readily takes place due to deficient adhesive strength and the separated part gives rise to the defects such as layer hardening failure due to polymerization inhibition by oxygen.

In order to improve. adhesive property between these two layers, various attempts have been made. For example, U.S. Pat. Nos. 299,501 and 44,563 describe a technique of mixing from 20 to 60 wt % of an acrylic emulsion or water-insoluble vinyl pyrrolidone-vinyl acetate copolymer in a hydrophilic polymer mainly comprising polyvinyl alcohol and then superposing it on the polymerization layer, thereby obtaining a sufficiently high adhesive property. These known techniques all may be applied to the protective layer in the present invention. The method for coating the protective layer is described in detail, for example, in U.S. Pat. No. 3,458,311 and JP-A-55-49729.

The protective layer may also be imparted with other functions. For example, by adding a coloring agent (e.g., water-soluble dye) capable of showing excellent transmittance of light at from 350 to 450 nm used for the exposure and efficiently absorbing light of 500 nm or more, the safe light immunity can be more elevated without causing any reduction in the sensitivity.

The photosensitive material using the photosensitive composition of the present invention is, when used as an image forming material, imagewise exposed and then the unexposed area of the photosensitive layer is removed by a developer to obtain an image. When the photosensitive composition is used in the manufacture of a lithographic printing plate, the developer which can be preferably used includes the developer described in JP-B-57-7427. An aqueous solution of an inorganic alkali. agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia, or an aqueous solution of an organic alkali agent such as monoethanolamine and diethanolamine is suitably used. The alkali agent is added to give an alkali solution having a concentration of from 0.1 to 10 wt % preferably from 0.5 to 5 wt %.

The above-described alkalineaqueous solution may contain a small amount of a surface active. agent or an organic solvent such as benzyl alcohol, 2-phenoxyethanol or 2-butoxyethanol, if desired. Examples thereof include those described in U.S. Pat. Nos. 3,375,171 and 3,615,480.

Furthermore, the developers described in JP-A-50-26601, JP-A-58-54341, JP-B-56-39464 and JP-B-56-42860 are also excellent.

In the plate-making process of a lithographic printing precursor using the photosensitive composition of the present invention, the entire surface may be heated, if desired, before or during the exposure or between the exposure and the development. By this heating, the image formation reaction in the photosensitive layer is accelerated to yield advantageous effects such as improvement of sensitivity and press life or stabilization of sensitivity. Furthermore, for the purpose of improving image strength/ press life, it is effective to entirely heating or exposing the image after the development. In usual, heating before the development is performed preferably in a mild condition of 150° C. or less. If the temperature is excessively high, the non-image area is also disadvantageously fogged. Heating after the development is performed in a very severe condition usually of from 200 to 500° C. If the temperature is low, a sufficiently high image intensifying effect may not be obtained, whereas if it is excessively high, there arise problems such as deterioration of the support or thermal decomposition of the image area.

The scan exposure lithographic printing plate using the photosensitive composition of the present invention is exposed by a known method without any limitation. The wavelength of the light source is preferably from 350 to 450 nm and specifically, an InGaN-type semiconductor is suitably used. As the exposure mechanism, any of the internal drum system, the external drum system, the flat bed system and the like may be used. The components for the photosensitive layer for use in the present invention may be rendered soluble in neutral water or alkalescent water by using highly water-soluble components. The lithographic printing plate constructed as such may be loaded on a printing machine and then processed by an exposure-development method on the machine.

Other examples of the light source for exposure of the photosensitive composition of the present invention include various mercury lamps such as ultrahigh-pressure mercury lamp, high-pressure mercury lamp, medium-pressure mercury lamp and low-pressure mercury lamp, a chemical lamp, a carbon arc lamp, a xenon lamp, a metal halide lamp, various laser lamps such as visible laser lamp and ultraviolet laser lamp, a fluorescent lamp, a tungsten lamp and sunlight. The photosensitive composition of the present invention may be applied not only to the scan exposure lithographic printing plate but also to those known as uses of photocurable resin over a wide range without any limitation.

Examples of the laser light source having a wavelength of from 350 to 450 nm which can be obtained at present and used include the followings.

Examples of the gas laser include Ar ion laser (364 nm, 351 nm, 10 mW to 1 W), Kr ion laser (356 nm, 351 nm, 10 mW to 1W), and He-Cd laser (441 nm, 325 nm, 1 mW to 100 mW).

Examples of the solid laser include a twice combination (355 nm, 5 mW to 1 W) of Nd:YAG (YVO) and SHG crystal, and a combination (430 nm, 10 mW) of Cr:LiSAF and SHG crystal.

Examples of the semiconductor laser system include $KNbO_3$ ring reconator (430 nm, 30 mW), a combination (380 nm to 450 nm, 5 mW to 100 mW) of wave-guided wavelength sensing element with AlGaAs or InGaAs semiconductor, a combination (300 nm to 350 nm, 5 mw to 100 mW) of wave-guided wavelength sensing element with AlGaInP or AlGaAs semiconductor, and AlGaInN (350 to 450 nm, 5 mW to 30 mW).

Examples of the pulse laser include $N_2$ laser (337 nm, pulse: 0.1 to 10 mJ) and XeF (351 nm, pulse: 10 to 250 mJ).

Among these, AlGaInN semiconductor (commercially available InGaN-system semiconductor layer, 400 to 410 nm, 5 to 30 mW) is preferred in view of wavelength properties and cost.

Examples of the exposure mechanism in the exposing apparatus for the lithographic printing plate by a scan-exposure system include an internal drum system, an external drum system and a flat bed system. With respect to the light source, those capable of continuous oscillation out of the above-described light sources may be preferably used. In practice, the following exposure apparatuses are particularly preferred from the relationship between the sensitivity of photosensitive material and the plate-making time:

a single, double or triple beam exposing apparatus of internal drum system, where one or more gas or solid laser is used such that the semiconductor layer has a total output of 20 mW or more;

a multi-beam (from 1 to 10 beams) exposing apparatus of flat bed system, where one or more semiconductor, gas or solid laser is used to have a total output of 20 mW or more;

a multi-beam (from 1 to 9 beams) exposing apparatus of external drum system, where one or more semiconductor, gas or solid laser is used to have a total output of 20 mW or more; and a multi-beam (10 or more beams) exposing apparatus of external drum system, where one or more semiconductor or solid laser is used to have a total output of 20 mW or more.

In the case of the above-described laser direct drawing-type lithographic printing plate, the following equation (eq1) is generally established among the sensitivity X (J/cm$^2$) of photosensitive material, the exposure area S (cm$^2$) of photosensitive material, the power q (W) of one laser light source, number n of lasers and the total exposure time t (s):

$$X \cdot S = n \cdot q \cdot t \tag{eq1}$$

1) Internal Drum (Single Beam) System

In general, the following equation (eq2) is established among the laser rotation number f (radian/s), the sub-scanning length Lx (cm) of photosensitive material, the resolution Z (dot/cm) and the total exposure time t (s):

$$f \cdot Z \cdot t = Lx \tag{eq2}$$

ii) External Drum (Multi-beam) System

In general, the following equation (eq3) is established among the drum rotation number F (radian/s), the sub-scanning length Lx (cm) of photosensitive material, the resolution Z (dot/cm), the total exposure time t (s) and the number (n) of beams:

$$F \cdot Z \cdot n \cdot t = Lx \tag{eq3}$$

iii) Flat Head (Multi-beam) System

In general, the following equation (eq4) is established among the rotation number H (radian/s) or polygon mirror, the sub-scanning length Lx (cm) of photosensitive material, the resolution Z (dot/cm), the total exposure time t (s) and the number (n) of beams:

$$H \cdot Z \cdot n \cdot t = Lx \tag{eq4}$$

Substitute to the above-described equations the resolution (2,560 dpi), the plate size (A1/B1, sub-scanning length: 42 inch), the exposure condition of about 20 sheets/hr and the photosensitive properties (sensitive wavelength, sensitivity: about 0.1 mJ/cm ) of the photosensitive composition of the present invention, which are required for the actual printing plate. Then, it is understood that a combination of the photosensitive material of the present invention with a multi-beam exposure system using a laser having a total output of 20 mW or more is particularly preferred. Furthermore, by taking account of the operability, cost and the like, a combination with a semiconductor laser multi-beam (10 or more beams) exposing apparatus of external drum system is most preferred.

For example, when the photosensitive composition of the present invention is applied to a liquid photosensitive composition using, if desired, a cation polymerizable compound in combination, a high-sensitivity material for photo fabrication may be obtained. Also, by using the change in the refractive index accompanying the photopolymerization, a hologram material may be formed. Furthermore, application to various transfer materials (e.g., peelable photosensitive material, toner developable photosensitive material) may be attained by using the change in the surface viscosity accompanying the photopolymerization. In addition, applications to photocuring of a microcapsule, production of an electric material such as photoresist, or photocurable resin materials such as ink, paint and adhesive, may also be available.

The initiation system comprising a carbonyl compound and titanocene according to the present invention is a photoinitiation system having excellent sensitivity and high stability, and has various use methods other than the photosensitive composition described in detail above. For example, the highly efficient radical generation by light may be used for bringing out oxidation coloring in high sensitivity of a triphenylmethane-base leuco dye or for causing decoloration reaction of a certain kind of polymethine-base dyes by the radical addition. Furthermore, the initiation system of the present invention generates an acid component simultaneously with radicals by light, therefore, when the initiation system is combined with a compound of which absorption changes by an acid, with a resin composition which undertakes cross-linking reaction by an acid, or with a resin composition which decomposes by an acid to have improved solubility, a high-sensitivity image-forming material may be obtained.

EXAMPLES

The present invention will be described in greater detail by referring to the following Examples, but the invention should not be construed as being limited thereto.

Reference Test

The emission intensity distribution of a safe light commonly used was measured and the position where the emission intensity distribution rises on the short wave side was determined. Furthermore, workability under respective safelights was evaluated. The evaluation results are shown in Table 1-1 below.

TABLE 1-1

| Safelight | Short Wave End of Emission | Workability |
|---|---|---|
| White lamp | 400 nm | Good |
| Yellow lamp | 520 nm | Sufficiently high brightness for working |
| Orange lamp | 570 nm | Fairly dark and difficult to work. It takes a time to be familiar with working. |
| Red lamp | 600 nm | Very dark. Skill is necessary for working. |

As seen in the Table, yellow lamp is preferred in view of workability and the photosensitive material capable of handling under yellow lamp is necessary to have low sensitivity in the wavelength region longer than at least 520 nm,, preferably 490 nm.

Examples 1-1 to 1-14 and Comparative Examples 1-1 to 1-2

Lithographic printing plates were prepared using the photosensitive composition of the present invention and examined on the sensitivity to the short wavelength light or on the safelight immunity.

Preparation of Support

A 0.3 nm-thick aluminum plate was etched at 60° C. for 25 seconds by dipping it in 10 wt % sodium hydroxide, washed with flowing water, neutralization-washed with 20wt % nitric acid and then washed with water. The resulting plate was subjected to electrolytic graining in a 1 wt % aqueous nitric acid solution using a sine-waveform alternating current with an anode time electricity of 300 coulomb/ dm². Subsequently, the plate was dipped in a 1 wt % aqueous sodium hydroxide solution at 40° C. for 5 seconds, desmutted at 60° C. for 40 seconds by dipping it in a 30 wt % aqueous sulfuric acid solution, and then anodized in a 20 wt % aqueous sulfuric acid solution at a current density of 2 A/dm² for 2 minutes to form an anodic oxide film having a thickness of 2.7 g/m². The surface roughness was measured and found to be 0.3 μm (Ra indication according to JIS. B0601).

On the back surface of the thus-treated substrate, the following solgel reaction solution was coated by a bar coater and dried at 100° C. for 1 minute to prepare a support having provided thereon a backcoat layer having a dry coated amount of 70 mg/m².

| Sol-Gel Reaction Solution: | |
|---|---|
| Tetraethyl silicate | 50 parts by weight |
| water | 20 parts by weight |
| Methanol | 15 parts by weight |
| Phosphoric acid | 0.05 parts by weight |

The components shown above were mixed and stirred, then, heat generation was initiated within about 5 minutes. After allowing the reaction to proceed for 60 minutes, the following solution was added to prepare a coating solution for the back-coat layer.

| | |
|---|---|
| Pyrogallol-formaldehyde condensed resin (molecular weight: 2,000) | 4 parts by weight |
| Dimethyl phthalate | 5 parts by weight |
| Fluorine-base surface active agent (N-butylperfluorooctane sulfonamidoethyl acrylate/ polyoxyethylene acrylate copolymer, molecular weight: 20,000) | 0.7 parts by weight |
| Methanol silica sol (produced by Nissan Kagaku Kogyo K.K., methanol: 30 wt %) | 50 parts by weight |
| Methanol | 800 parts by weight |

Preparation of Photosensitive Layer

On the thus-processed aluminum plate, a photosensitive composition having the following composition was coated to have a dry coated amount of 1.4 g/m., and dried at 80° C. for 2 minutes to form a photosensitive layer.

| | |
|---|---|
| Pentaerythritol tetraacrylate | 1.5 g |
| Benzyl methacrylate/methacrylic acid copolymer (copolymerization molar ratio: 75/25) | 2.0 g |
| Photopolymerization initiating system (see Table 1-2 below) | |
| Sensitizing dye (D1 to D14, H1, H2) | 0.05 g |
| Titanocene compound (T-1) | 0.03 g |
| Fluorine-base nonionic surface active agent (F-177P) | 0.03 g |
| Thermal polymerization inhibitor N-nitrosophenylhydroxylamine aluminum salt | 0.01 g |
| Pigment dispersion | 2.0 g |
| Composition of Pigment Dispersion: | |
| Composition: Piqrttent Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Methyl ethyl ketone | 20 g |
| Propylene glycol monomethyl ether | 20 g |

The structures of Sensitizing Dyes D1 to D14 are shown above. The structures of Sensitizing Dyes H1 and H2 and Titanocene Compound T-1 are shown below.

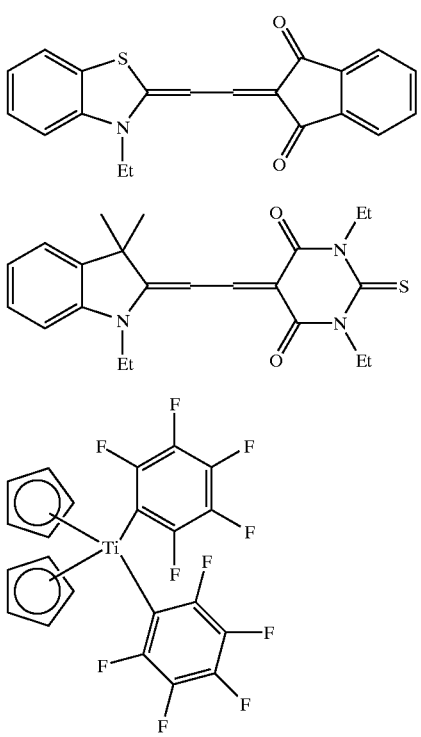

(H1)

(H2)

(T-1)

Preparation of Protective Layer

On the thus-formed photosensitive layer, a 3 wt % aqueous solution of polyvinyl alcohol (sanctification degree: 98 mol %, polymerization degree: 550) was coated to have a dry coated weight of 2 g/m and dried at 100° C. for 2 minutes.

Evaluation of Photosensitivity and Safelight Immunity

On the thus-obtained photosensitive materials, Fuji Step Guide (a gray scale discontinuously varied in the transmission optical density by ΔD=0.15) manufactured by Fuji Photo Film Co., Ltd. was tightly contacted. Thereafter, the photosensitive materials each was exposed to a xenon lamp through an optical filter to give a known exposure energy, and then developed at 25° C. for 10 seconds by dipping it in a developer having the following composition. The highest step number where the image was completely removed was read and the sensitivity was calculated therefrom. The higher the step number is, the higher the sensitivity is. For the purpose of estimating the suitability for exposure with a short wave semiconductor laser, exposure was performed using Kenko BD-41 as an optical filter under monochromic light of 410 nm. For the purpose of estimating the yellow lamp immunity, exposure was performed using BP-49 under monochromic light of 490 nm. It is preferred that the sensitivity at 410 nm is high and the sensitivity at 490 nm is low. The ratio of sensitivity (mJ/cm²) at 410 m/sensitivity (mJ/cm²) at 490 nm thus obtained is shown in Table 1-2 below. The larger value is more preferred. The results obtained are shown in Table 1-2 below together with the absorption maximum of sensitizing dye in solution and the solvent used for the measurement.

TABLE 1-2

| Photosensitive Material | Sensitizing Dye | Absorption Maximum of Sensitizing Dye [nm (MeOH)] | Sensitivity at 410 nm/ Sensitivity at 490 nm |
|---|---|---|---|
| Example 1-1 | D1 | 380 | 100 or more |
| Example 1-2 | D2 | 390 | 100 or more |
| Example 1-3 | D3 | 380 | 100 or more |
| Example 1-4 | D4 | 415 | 100 or more |
| Example 1-5 | D5 | 380 | 100 or more |
| Example 1-6 | D6 | 408 | 90 |
| Example 1-7 | D7 | 414 | 90 |
| Example 1-8 | D8 | 390 | 100 or more |
| Example 1-9 | D9 | 373 | 100 or more |
| Example 1-10 | D10 | 433 | 70 |
| Example 1-11 | D11 | 429 | 70 |
| Example 1-12 | D12 | 440 | 50 |
| Example 1-13 | D13 | 436 | 80 |
| Example 1-14 | D14 | 380 | 100 or more |
| Comparative Example 1-1 | H1 | 505 | 0.3 |
| Comparative Example 1-2 | H2 | 490 | 0.2 |

As such, the lithographic printing plates using the photosensitive composition of the present invention exhibited extremely high sensitivity at 410 nm corresponding to the oscillation wavelength of a short wave semiconductor laser as compared with the sensitivity at the wavelength of 490 nm corresponding to the fog under a yellow lamp, verifying that they are a lithographic printing plate having excellent safelight immunity. On the other hand, conventionally known lithographic printing plates using a carbomerocyanine sensitizing dye rather exhibited high sensitivity at 490 nm, revealing absolute lack of safelight immunity.

Examples 1-15 to 1-31 and Comparative Examples 1-3 to 1-8

Lithographic printing precursors were obtained in the same manner as in Examples 1-1 to 1-14 except that the following composition was used for the photosensitive layer to have a coated amount of 1.0 g/m². In the same manner, exposure at 360 nm or 410 nm was performed and the clear sensitivity was determined (see Table 1-3 below).

| | |
|---|---|
| Pentaerythritol tetraacrylate | 20 parts by weight |
| Allyl methacrylate/methacrylic acid copolymer (copolymerization molar ratio: 80/20) | 20 parts by weight |
| Photopolymerization initiating system (shown in Table 1-3 below) Sensitizing dye Titanocene compound Co-sensitizer | |
| Fluorine-base nonionic surface active agent (F-177P) | 0.3 parts by weight |
| Thermal polymerization inhibitor N-nitrosophenylhydroxylamine aluminum salt | 0.1 parts by weight |
| Pigment dispersion Composition of Pigment Dispersion: | 0.6 parts by weight |
| Composition: Pigment Blue 15:6 | 15 parts by weight |
| Allyl methacrylate/methacrylic acid copolymer (copolymerization molar ratio: 83/17) | 10 parts by weight |

The structures of sensitizing dyes used and Titanocene Compound T-1 are shown above. The structures of Titanocene Compound T-2 and Co-Sensitizers H-3 to H-8 are shown below.

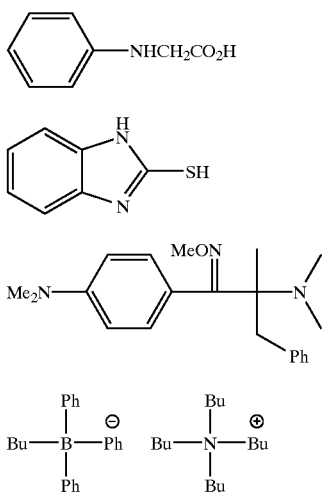

(H3)

(H4)

(H5)

(H6)

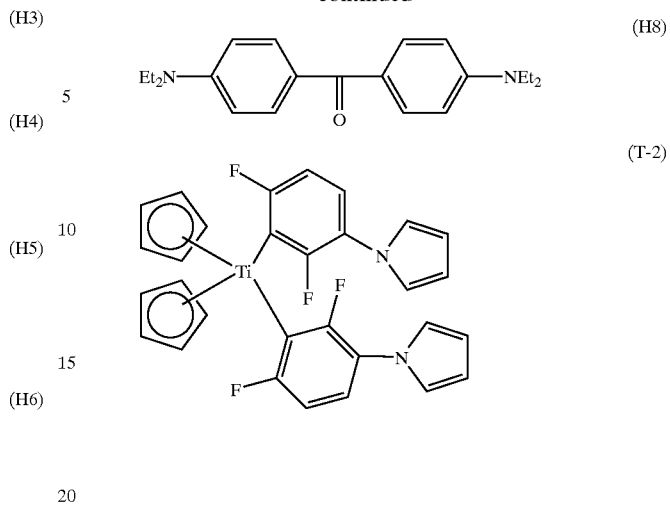

(H8)

(T-2)

TABLE 1-3

| | Initiation System (amount added based on the entire solid content of photopolymerizing layer, wt %) | | | Exposure Wave- length (nm) | Clear Sensi- tivity (mJ/cm$^2$) |
|---|---|---|---|---|---|
| | Sensitizing Dye | Titanocene Compound | Co-Sensi- tizer | | |
| Example 1-15 | D1 (1.0) | T-2 (1.8) | none | 410 | 0.3 |
| Example 1-16 | D1 (1.0) | T-2 (1.0) | none | 410 | 0.3 |
| Example 1-17 | D1 (1.0) | T-2 (1.0) | H-5 (5.0) | 410 | 0.15 |
| Example 1-18 | D1 (1.0) | T-2 (1.0) | H-8 (3.0) | 410 | 0.3 |
| Example 1-19 | D11 (1.2) | T-2 (0.8) | none | 410 | 0.2 |
| Example 1-20 | D11 (1.0) | T-1 (2.8) | H-7 (3.0) | 410 | 0.15 |
| Example 1-21 | D30 (1.2) | T-1 (1.8) | H-4 (10) | 410 | 0.1 |
| Example 1-22 | D12 (0.8) | T-1 (1.8) | none | 410 | 0.3 |
| Example 1-23 | D21 (0.9) | T-1 (0.5) | H-5 (5.0) | 360 | 0.2 |
| Example 1-24 | D28 (1.5) | T-2 (3.0) | H-3 (2.0) | 360 | 0.3 |
| Example 1-25 | D29 (1.8) | T-1 (1.0) | H-6 (3.0) | 360 | 0.3 |
| Example 1-26 | D31 (2.0) | T-2 (1.5) | none | 360 | 0.25 |
| Example 1-27 | D35 (1.5) | T-2 (3.0) | none | 410 | 0.20 |
| Example 1-28 | D36 (0.9) | T-2 (0.8) | H-4 (5.0) | 410 | 0.1 |
| Example 1-29 | D50 (0.8) | T-2 (0.9) | H-5 (5.0) | 410 | 0.1 |
| Example 1-30 | D52 (0.9) | T-2 (1.8) | none | 410 | 0.3 |
| Example 1-31 | D53 (1.0) | T-2 (1.0) | none | 410 | 0.2 |
| Comparative Example 1-3 | none | T-2 (1.8) | none | 410 | 0.8 |
| Comparative Example 1-4 | D1 (1.0) | none | none | 410 | 2.0 |
| Comparative Example 1-5 | D1 (1.0) | none | H-8 (2.0) | 410 | 1.0 |
| Comparative Example 1-6 | D11 (1.0) | none | H-7 (3.0) | 410 | 0.8 |
| Comparative Example 1-7 | D30 (1.0) | none | H-4 (10) | 410 | 3.0 |
| Comparative Example 1-8 | H1 | T-2 (2.8) | none | 410 | 1.0 |

As such, the lithographic printing plates using the photosensitive composition of the present invention are very highly sensitive and exhibit sufficiently high sensitivity in the scan exposure.

As apparently seen from the comparison between Comparative Examples 1-3 and 1-4 with Example 1-16, the photoinitiation system comprising a combination of a carbonyl compound and a titanocene compound according to the present invention shows very high sensitivity as compared with the case where these compounds are used individually. Furthermore, the sensitivity is by far higher than -continued

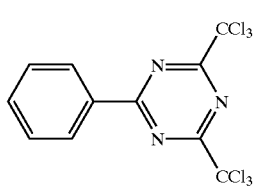

(H7)

that of photoinitiation systems using a conventionally known combination (Comparative Examples 1-5 to 1-8).

Example 1-32

A lithographic printing precursor was prepared in the same manner as in Examples 1-15 to 1-31 except that the photoinitiation system was changed to the following composition and the thickness of the photopolymerizing layer was changed to 1.5 g/m².

| Initiation System | Content in the Entire Solid Content of Photopolymerizing Layer |
|---|---|
| Sensitizing Dye D50 | 1.2 wt % |
| Titanocene T-2 | 1.5 wt % |
| Co-Sensitizer H-5 | 7.0 wt % |

The thus-obtained lithographic printing precursor was subjected to scan exposure using an InGaN-system semiconductor laser having an oscillation wavelength of 410 nm under conditions of giving a beam system on the plate surface of 25 μm and an exposure energy density of 0.2 mJ/cm². Thereafter, the plate was heated at 100° C. for 10 seconds and then subjected to the development described above.

As a result, a lithographic printing plate having excellent visibility and having a blue image was obtained. Using the plate obtained, off-set printing was performed in KOR-D Machine manufactured by Heidelberg, then, 50,000 sheets or more of printed matters having high image density and good anti-fouling property could be obtained.

Example 1-33

The plate of Example 1-32 was exposed under a yellow light for 1 hour before the exposure and then subjected to plate mating and printing thoroughly in the same manner as in Example 1-32. Completely the same good results as in Example 32 were obtained.

Example 1-34

The plate of Example 1-32 was stored under forced storage conditions of 65% humidity and 45° C. and then subjected to plate making and printing thoroughly in the same manner as in Example 1-32. The same good results as in Example 1-32 were obtained.

Example 1-35

A lithographic printing precursor was prepared in the same manner as in Example 1-32 except that the initiation system was changed to the following composition and the thickness of the photopolymerizing layer was changed to 2.0 g/m².

| Initiation System | Content in the Entire Solid Content of Photopolymerizing Layer |
|---|---|
| Sensitizing Dye D11 | 1.5 wt % |
| Titanocene T-2 | 1.5 wt % |
| Co-Sensitizer H-5 | 5.0 wt % |

The thus-obtained lithographic printing precursor was subjected to scan exposure using an InGaN-system semiconductor laser having an oscillation wavelength of 410 nm under conditions of giving a beam system on the plate surface of 25 μm and an exposure energy density of 0.15 mJ/cm². Thereafter, the plate was heated at 100° C. for 10 seconds and then subjected to the development described above. As a result, a lithographic printing plate having excellent visibility and having a blue image was obtained. Using the plate obtained, off-set printing was performed in KOR-D Machine manufactured by Heidelberg, then, 200,000 sheets or more of printed matters having high image density and good anti-fouling property could be obtained.

Example 1-36

On a PET film, a photosensitive layer comprising the following composition was coated to have a coated amount of 2.0 g/m².

| | Content in the Entire Solid Content of Photopolymerizing Layer |
|---|---|
| Binder resin (polymethyl methacrylate) | 90 wt % |
| Sensitizing Dye D11 | 1.5 wt % |
| Titanocene T-2 | 1.5 wt % |
| Co-Sensitizer H-5 | 5.0 wt % |
| Acid decaloring dye (naphthalene-sulfonate of Victoria Pure Blue) | 2.0 wt % |

The thus-obtained blue photosensitive material was exposed to a metal halide lamp for 30 seconds. As a result, the blue color of the acid decoloring dye completely disappeared and the material was changed into a pale yellow transparent film. This reveals that the initiation system of the present invention functions also as an acid generator.

Example 1-37

On a PET film, a photosensitive layer comprising the following composition was coated to have a coated amount of 2.0 g/m².

| | Content in the Entire Solid Content of Photopolymerizing Layer |
|---|---|
| Binder resin (polybenzyl methacrylate) | 90 wt % |
| Sensitizing Dye D29 | 1.5 wt % |
| Titanocene T-2 | 1.5 wt % |
| Co-Sensitizer H-5 | 5.0 wt % |
| Oxidation coloring dye (Leuco Crystal Violet) | 2.0 wt % |

The pale yellow transparent photosensitive material obtained was exposed to a metal halide lamp for 60 seconds. As a result, the material was colored clear blue. This color formation is considered to be oxidation coloring of the leuco dye by the generation of radicals in the photoinitiation system.

Examples 2-1 To 2-35 and Comparative Examples 2-1 and 2-2 Preparation of Support A 0.30 mm-thick aluminum plate was etched at 60° C. for 25 seconds by dipping it in 10 wt % sodium hydroxide, washed with flowing water, neutralization-washed with 20 wt % nitric acid and then washed with water. The resulting plate was subjected to electrolytic graining in a 1 wt % aqueous nitric acid solution using a sine-waveform alternating current with an anode time electricity of 300 coulomb/dm². Subsequently, the plate was dipped in a 1 wt % aqueous sodium hydroxide solution at 40° C. for 5 seconds, desmutted at 60° C. for 40 seconds by dipping it in a 30 wt % aqueous sulfuric acid solution, and then anodized in a 20 wt % aqueous sulfuric acid solution at a current density of 2 A/dm² for 2 minutes to form an anodic oxide film having a thickness of 2.7 g/m². The surface roughness was measured and found to be 0.3 μm (Ra indication according to JIS B0601).

On the back surface of the thus-treated substrate, the following sol-gel reaction solution was coated by a bar coater and dried at 100° C. for 1 minute to prepare a support having provided thereon a backcoat layer having a dry, coated amount of 70 mg/m².

| Sol-Gel Reaction Solution: | |
| --- | --- |
| Tetraethyl silicate | 50 parts by weight |
| Water | 20 parts by weight |
| Methanol | 15 parts by weight |
| Phosphoric acid | 0.05 parts by weight |

The components shown above were mixed and stirred, then, heat generation was initiated within about 5 minutes. After allowing the reaction to proceed for 60 minutes, the following solution was added to prepare a coating solution for the backcoat layer.

| | |
| --- | --- |
| Pyrogallo formaldehyde condensed resin (molecular weight: 2,000) | 4 parts by weight |
| Dimethyl phthalate | 5 parts by weight |
| Fluorine-base surface active agent (N-butylperfluorooctane sulfonamidoethyl acrylate/polyoxyethylene acrylate copolymer, molecular weight: 20,000) | 0.7 parts by weight |
| Methanol silica sol (produced by Nissan Kagaku Kogyo K.K., methanol: 30 wt %) | 50 parts by weight |
| Methanol | 800 parts by weight |

Preparation of Photosensitive Layer

On the thus-processed aluminum plate, a photopolymerizable composition having the following composition was coated to have a dry coated amount of 1.4 g/m², and dried at 80° C. for 2 minutes to form a photosensitive layer.

| | |
| --- | --- |
| Pentaerythritol tetraacrylate | 1.5 g |
| Benzyl methacrylate/methacrylic acid copolymer (copolymerization molar ratio: 75/25) | 2.0 g |
| Photopolymerization initiating system (see Table 2-2 below) | |
| Sensitizing dye (D201 to D235, H1, H2) | 0.05 g |
| Titanocene compound (T-1) | 0.03 g |
| Fluorine-base nonionic surface active agent (F-177P) | 0.03 g |
| Thermal polymerization inhibitor N-nitrosophenylhydroxylamine aluminum salt | 0.01 g |
| Pigment dispersion | 2.0 g |
| Composition of Pigment Dispersion: | |
| Composition: Pigment Blue 15:6 | 15 parts by weight |
| Allyl methacrylate/methacrylic acid copolymer (copolymerization molar ratio: 83/17) | 10 parts by wei#t |
| Cyclohexanone | 15 parts by weight |

| -continued | |
| --- | --- |
| Methoxypropyl acetate | 20 parts by weight |
| Propylene glycol monomethyl ether | 40 parts by weight |
| Methyl ethyl ketone | 20 g |
| Propylene glycol monomethyl ether | 20 g |

The structures of Sensitizing Dyes D201 to D235 are shown above. The structures of Sensitizing Dyes H1 and H2 and Titanocene Compound T-1 are shown below.

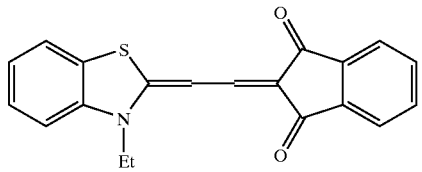
(H1)

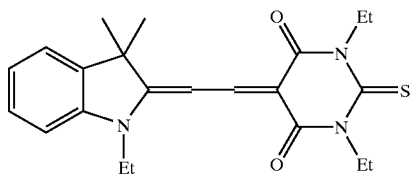
(H2)

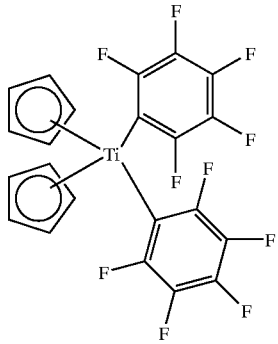
(T-1)

Preparation of Protective Layer

On the thus-formed photosensitive layer, a 3 wt % aqueous solution of polyvinyl alcohol (saponification degree: 98 mol %, polymerization degree: 550) was coated to have a dry coated weight of 2 g/m² and dried at 100° C. for 2 minutes.

Evaluation of Photosensitivity and Safelight Immunity

On the thus-obtained photosensitive materials, Fuji Step Guide (a gray scale discontinuously varied in the transmission optical density by ΔD=0.15) manufactured by Fuji Photo Film Co., Ltd. was tightly contacted. Thereafter, the photosensitive materials each was exposed to a xenon lamp through an optical filter to give a known exposure energy, and then developed at 25° C. for 10 seconds by dipping it in a developer having the following composition. The highest step number where the image was completely removed was read and the sensitivity was calculated therefrom. The higher the step number is, the higher the sensitivity is. For the purpose of estimating the suitability for exposure with a short wave semiconductor laser, exposure was performed using Kenko BP-41 as an optical filter under monochromic light of 410 nm. For the purpose of estimating the yellow lamp immunity, exposure was performed using BP-49 under monochromic light of 490 nm. It is preferred that the sensitivity at 410 nm is high and the sensitivity at 490 nm is low. The ratio of sensitivity (mJ/cm²) at 410 m/sensitivity (mJ/cm²) at 490 nm is shown in Table 2-2 below. The larger value is more preferred. The results obtained are shown in Table 2-2 below together with the absorption maximum of sensitizing dye in solution and the solvent used for the measurement.

TABLE 2-2

| Photosensitive Material | Sensitizing Dye | Absorption Maximum of Sensitizing Dye [nm (solvent)] | Sensitivity at 410 nm/ Sensitivity at 490 nm |
|---|---|---|---|
| Example 2-1 | D201 | 414 (Me-OH) | 100 or more |
| Example 2-2 | D202 | 428 (Me-OH) | 70 |
| Example 2-3 | D203 | 402 (THF) | 100 or more |
| Example 2-4 | D204 | 419 (THF) | 100 or more |
| Example 2-5 | D205 | 410 (Me-OH) | 100 or more |
| Example 2-6 | D206 | 402 (THF) | 100 or more |
| Example 2-7 | D207 | 377 (THF) | 100 or more |
| Example 2-8 | D208 | 378 (THF) | 100 or more |
| Example 2-9 | D209 | 376 (Me-OH) | 100 or more |
| Example 2-10 | D210 | 392 (Et-OH) | 100 or more |
| Example 2-11 | D211 | 383 (THF) | 100 or more |
| Example 2-12 | D212 | 387 (THF) | 100 or more |
| Example 2-13 | D213 | 378 (Me-OH) | 100 or more |
| Example 2-14 | D214 | 366 (CHCl₃) | 100 or more |
| Example 2-15 | D215 | 340 (THF) | 100 or more |
| Example 2-16 | D216 | 357 (THF) | 100 or more |
| Example 2-17 | D217 | 412 (THF) | 100 or more |
| Example 2-18 | D218 | 404 (THF) | 100 or more |
| Example 2-19 | D219 | 416 (THF) | 100 or more |
| Example 2-20 | D220 | 430 (THF) | 60 |
| Example 2-21 | D221 | 379 (THF) | 100 or more |
| Example 2-22 | D222 | 411 (THF) | 100 or more |
| Example 2-23 | D223 | 398 (THF) | 100 or more |
| Example 2-24 | D224 | 439 (Me-OH) | 100 or more |
| Example 2-25 | D225 | 376 (THF) | 100 or more |
| Example 2-26 | D226 | 382 (THF) | 100 or more |
| Example 2-27 | D227 | 399 (THF) | 100 or more |
| Example 2-28 | D228 | 436 (Me-OH) | 55 |
| Example 2-29 | D229 | 409 (THF) | 100 or more |
| Example 2-30 | D230 | 404 (THF) | 100 or more |
| Example 2-31 | D231 | 430 (THF) | 100 or more |
| Example 2-32 | D232 | 441 (THF) | 20 |
| Example 2-33 | D233 | 444 (THF) | 25 |
| Example 2-34 | D234 | 394 (THF) | 100 or more |
| Example 2-35 | D235 | 434 (THF) | 100 or more |
| Comparative Example 2-1 | H1 | 505 (Me-OH) | 0.3 |
| Comparative Example 2-2 | H2 | 490 (Me-OH) | 0.2 |

As such, the lithographic printing plates for use in the plate-making process of the present invention exhibited extremely high sensitivity at 410 nm corresponding to the oscillation wavelength of a short wave semiconductor laser as compared with the sensitivity at the wavelength of 490 nm corresponding to the fog under a yellow lamp, verifying that they are a lithographic printing plate having excellent safelight immunity. On the other hand, conventionally known lithographic printing plates using a carbomerocyanine sensitizing dye rather exhibited high sensitivity at 490 nm, revealing absolute lack: of safelight immunity.

Examples 2-36 to 2-43 and Comparative Examples 2-3 to 9-5

Lithographic printing precursors were obtained in the same manner as in Examples 2-1 to 2-35 except that the following composition was used for the photopolymerizable layer to have a coated amount of 1.0 g/m². Also in the same manner, exposure at 410 nm was performed and the clear sensitivity was determined. The results are shown in Table 2-3 below.

| | |
|---|---|
| Pentaerythritol tetraacrylate | 20 parts by weight |
| Allyl methacrylate/methacrylic acid copolymer (copolymerization molar ratio: 80/20) | 20 parts by weight |
| Photopolymerization initiating system (added in an amount shown in Table 2-3 below | |
| Sensitizing dye | |
| Titanocene compound | |
| Co-sensitizer | |
| Fluorine-base nonionic surface active agent (E-177P) | 0.3 parts by weight |
| Thermal polymerization inhibitor N-nitrosophenylhydroxylamine aluminum salt | 0.1 parts by weight |
| Pigment dispersion | 0.6 parts by weight |
| Composition of Pigment Dispersion: | |
| Composition: Pigment Blue 15:6 | 15 parts by weight |
| Allyl methacrylate/methacrylic acid copolymer (copolymerization molar ratio: 83/17) | 10 parts by weight |

The structures of sensitizing dyes and Titanocene Compound T-1 used are shown above. The structures of Titanocene Compounds T-2 and Co-Sensitizers H-3 and H-4 are shown below.

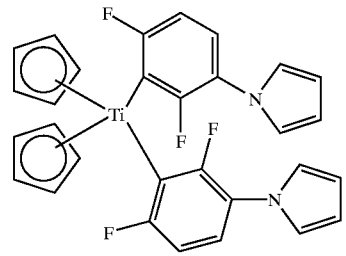

(T-2)

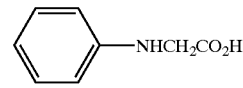

(H3)

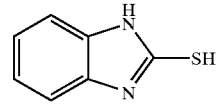

(H4)

TABLE 2-3

| | Initiation System (amount added based on the entire solid content of photopolymerizing layer, wt %) | | | Clear |
|---|---|---|---|---|
| | Sensitizing Dye | Titanocene Compound | Co-Sensitizer | Sensitivity (mJ/cm²) |
| Example 2-36 | D204 (1.0) | T-1 (1.0) | H-3 (5.0) | 0.2 |
| Example 2-37 | D207 (1.0) | T-1 (1.3) | H-3 (2.0) | 0.1 |
| Example 2-38 | D208 (1.5) | T-2 (1.8) | H-4 (5.0) | 0.1 |
| Example 2-39 | D217 (1.2) | T-2 (0.9) | none | 0.3 |
| Example 2-40 | D225 (1.0) | T-2 (2.8) | H-3 (10) | 0.2 |
| Example 2-41 | D244 (1.2) | T-1 (1.8) | none | 0.3 |
| Example 2-42 | D226 (0.8) | T-1 (1.8) | H-4 (3.0) | 0.1 |
| Example 2-43 | D211 (0.9) | T-1 (0.5) | none | 0.3 |
| Comparative Example 2-3 | none | T-2 (1.8) | none | 1.5 |
| Comparative Example 2-4 | none | T-2 (2.8) | none | 0.8 |

TABLE 2-3-continued

| | Initiation System (amount added based on the entire solid content of photopolymerizing layer, wt %) | | | Clear |
|---|---|---|---|---|
| | Sensitizing Dye | Titanocene Compound | Co-Sensitizer | Sensitivity (mJ/cm²) |
| Comparative Example 2-5 | none | T-2 (2.8) | H-3 (5.0) | 0.5 |

As such, the lithographic printing plates for use in the plate-making process of the present invention have very high sensitivity and exhibit sufficiently high sensitivity in the scan exposure method.

Furthermore, the initiation system of the present invention is highly sensitive as compared with the case of not using a sensitizing dye. In particular, even when the amount of titanocene added is small, sufficiently high sensitivity is attained.

Example 2-44

A lithographic printing precursor was prepared in the same manner as in Examples 2-36 to 2-43 except that the photoinitiation system was changed to the following composition and the thickness of the photopolymerizing layer was changed to 1.5 g/m².

| Initiation System | Content in the Entire Solid Content of Photopolymerizing Layer |
|---|---|
| Sensitizing Dye D230 | 1.2 wt % |
| Titanocene T-2 | 1.5 wt % |
| Co-Sensitizer H-5 | 7.0 wt % |

The structure of Co-Sensitizer H-5 is shown below.

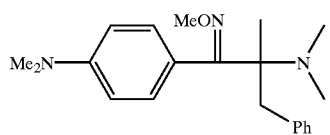

(H5)

The thus-obtained lithographic printing precursor was subjected to scan exposure using an InGaN-system semiconductor laser having an oscillation wavelength of 410 nm under conditions of giving a beam system on the plate surface of 25 µm and an exposure energy density of 0.2 mJ/cm². Thereafter, the plate was heated at 100° C. for 10 seconds and then subjected to the development described above.

As a result, a lithographic printing plate having excellent visibility and having a blue image was obtained. Using the plate obtained, off-set printing was performed in KOR-D Machine manufactured by Heidelberg, then, 50,000 sheets or more or printed matters having high image density and good anti-fouling property could be obtained.

Example 2-45

The plate of Example 2-44 was exposed under a yellow light for 1 hour before the exposure and then subjected to plate making and printing thoroughly in the same manner as in Example 2-44. Completely the same good results as in Example 2-44 were obtained.

Example 2-46

The plate of Example 2-44 was stored under forced storage conditions of 65% humidity and 45° C. and then subjected to plate making and printing thoroughly in the same manner as in Example 2-44. The same good results as in Example 2-44 were obtained.

Example 2-47

A lithographic printing precursor was prepared in the same manner as in Example 2-44 except that the initiation system was changed to the following composition and the thickness of the photopolymerizing layer was changed to 2.0 g/m².

| Initiation System | Content in the Entire Solid Content of Photopolymerizing Layer |
|---|---|
| Sensitizing Dye D208 | 1.5 wt % |
| Titanocene T-2 | 1.5 wt % |
| Co-Sensitizer H-5 | 5.0 wt % |

The thus-obtained lithographic printing precursor .as subjected to scan exposure using an InGaN-system semiconductor laser having an oscillation wavelength of 410 nm under conditions of giving a beam system on the plate surface of 25 µm and an exposure energy density of 0.15 mJ/cm². Thereafter, the plate was heated at 100° C. for 10 seconds and then subjected to the development described above. As a result, a lithographic printing plate having excellent visibility and having a blue image was obtained. The plate obtained was further seated at 300° C. for 5 minutes and used in the off-set printing by KOR-D Machine manufactured by Heidelberg, then, 200,000 sheets or more of printed matters having high image density and good anti-fouling property could be obtained.

The photosensitive composition of the present invention uses a specific carbonyl or merocyanine compound and a titanocene compound in combination, therefore, the composition has high sensitivity to the wavelength of from 350 to 450 nm and is freed from the effect of light at the wavelength in the vicinity of 500 nm. By virtue of this property, when the photosensitive composition of the present invention is used as a photosensitive layer of a lithographic printing precursor, the lithographic printing plate obtained can have sufficiently high sensitivity suitable for the scan exposure using a short wavelength semiconductor laser such as InGaN and also have good press life and excellent anti-fouling property. Furthermore, by using the photoinitiation system and the photopolymerizable composition of the present invention, the lithographic printing precursor for scan exposure obtained can be greatly improved in the fogging under a yellow light, handling workability, storage stability and the like.

The photosensitive composition of the present invention can give promise of its application not only in the technical field of CTP lithographic printing but also in the field of laser imaging such as photofabrication, holography and color hard copy, in the field of electric material production such as photoresist, and in the field of photocurable resin material such as ink, paint and adhesive.

While the invention has been described in detail with reference to specific examples thereof, it will be apparent to one skilled in the art that various changes and modifications can be made therein without departing from the spirit and scope thereof.

What is claimed is:

1. A photosensitive composition comprising:

a titanocene compound; and at least one dye selected from carbonyl compounds having an absorption maximum in the wavelength region of 350 to 450 nm and represented by formula (I-2):

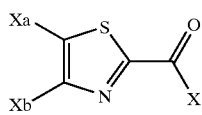

(I-2)

wherein X represents a substituted or unsubstituted alkyl, aryl, heteroaryl or alkenyl group, Xa and Xb each independently represents a substituted or unsubstituted alkyl group, an aryl group or a heteroaryl group, and Xa and Xb may be combined with each other to form a 5-, 6- or 7-membered aliphatic or aromatic ring.

2. The photosensitive composition according to claim 1, further comprising an addition polymerizable compound having at least one ethylenically unsaturated double bond.

3. A lithographic printing plate comprising a hydrophilic support having provided thereon a photosensitive layer comprising the photosensitive composition according to claim 1 wherein the titanocene compound is in an amount of from 0.5 to 1.9 parts by weight per 100 parts by weight of the photosensitive layer components.

4. A photosensitive composition comprising:

a titanocene compound; and at least one dye selected from carbonyl compounds having an absorption maximum in the wavelength region of 350 to 450 nm and represented by formula (II-2)

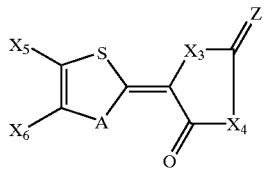

(II-2)

wherein A represents S atom or $NR_1$, $R_1$ represents an alkyl group or an aryl group, $X_3$, $X_4$ and Z each independently represents O atom, S atom or $NR_5$, $R_5$ represents an alkyl group or an aryl group and $X_5$ and $X_6$ each independently represents a substituted or unsubstituted alkyl group, an aryl group or a heteroaryl group, and $X_5$ and $X_6$ may be combined with each other to form a 5-, 6- or 7-membered aliphatic or aromatic ring.

5. A lithographic printing plate comprising a hydrophilic support having provided thereon a photosensitive layer comprising the photosensitive composition according to claim 4 wherein the titanocene compound is in an amount of from 0.5 to 1.9 parts by weight per 100 parts by weight of the photosensitive layer components.

6. A photosensitive composition comprising:

a titanocene compound; and at least one dye selected from carbonyl compounds having an absorption maximum in the wavelength region of 350 to 450 nm and represented by formula (II-4)

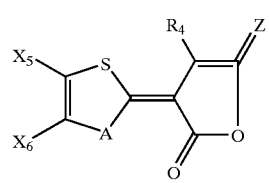

(II-4)

wherein A represents S atom or $NR_1$, $R_1$ represents an alkyl group or an aryl group, Z represents O atom, S atom or $NR_5$, $R_5$ represents an alkyl group or an aryl group, $X_5$ and $X_6$ each independently represents a substituted or unsubstituted alkyl group, an aryl group or a heteroaryl group, and $X_5$ and $X_6$ may be combined with each other to form a 5-, 6- or 7-membered aliphatic or aromatic ring and $R_4$ represents hydrogen atom, an alkyl group, an aryl group or a heteroaryl group.

7. A lithographic printing plate comprising a hydrophilic support having provided thereon a photosensitive layer comprising the photosensitive composition according to claim 6 wherein the titanocene compound is in an amount of from 0.5 to 1.9 parts by weight per 100 parts by weight of the photosensitive layer components.

* * * * *